(12) United States Patent
Arnold et al.

(10) Patent No.: US 11,368,049 B2
(45) Date of Patent: Jun. 21, 2022

(54) ELECTRODYNAMIC WIRELESS POWER RECEIVER

(71) Applicant: University of Florida Research Foundation, Inc., Gainesville, FL (US)

(72) Inventors: David Patrick Arnold, Gainesville, FL (US); Alexandra Garraud, Gainesville, FL (US); Nicolas Garraud, Gainesville, FL (US)

(73) Assignee: UNIVERSITY OF FLORIDA RESEARCH FOUNDATION, INC., Gainesville, FL (US)

(*) Notice: Subject to any disclaimer, the term of this patent is extended or adjusted under 35 U.S.C. 154(b) by 0 days.

(21) Appl. No.: 17/099,904

(22) Filed: Nov. 17, 2020

(65) Prior Publication Data

US 2021/0075266 A1    Mar. 11, 2021

Related U.S. Application Data

(63) Continuation-in-part of application No. PCT/US2019/027859, filed on Apr. 17, 2019.

(60) Provisional application No. 62/673,350, filed on May 18, 2018.

(51) Int. Cl.
  *H02J 50/00* (2016.01)
  *H02J 50/12* (2016.01)
  *H01L 41/04* (2006.01)
  *H01L 41/06* (2006.01)

(52) U.S. Cl.
  CPC .......... *H02J 50/005* (2020.01); *H01L 41/042* (2013.01); *H01L 41/06* (2013.01); *H02J 50/12* (2016.02)

(58) Field of Classification Search
  CPC ............. H02J 50/00; H04B 5/00; H01L 41/06
  See application file for complete search history.

(56) References Cited

U.S. PATENT DOCUMENTS

| | | | | |
|---|---|---|---|---|
| 2011/0304220 | A1* | 12/2011 | Whitehead | H02J 50/90 307/104 |
| 2013/0147427 | A1* | 6/2013 | Polu | H02J 50/12 320/108 |
| 2013/0192349 | A1* | 8/2013 | Ramkumar | G01N 29/02 73/54.41 |
| 2013/0241309 | A1* | 9/2013 | Arnold | H02J 50/10 307/104 |
| 2013/0334903 | A1* | 12/2013 | Kim | H02K 35/00 310/28 |
| 2016/0261233 | A1* | 9/2016 | Pohl | H04B 5/0037 |
| 2017/0155287 | A1* | 6/2017 | Arnold | H02K 35/02 |

FOREIGN PATENT DOCUMENTS

CN  107408837 A  * 11/2017 ............. H01F 38/14

\* cited by examiner

*Primary Examiner* — Adi Amrany
(74) *Attorney, Agent, or Firm* — Thomas Horstemeyer, LLP

(57) ABSTRACT

The present disclosure relates to systems and methods for electrodynamic wireless power receivers. In some examples, a wireless power receiver electromechanically converts energy from a magnetic field. The wireless power receiver includes a planar suspension structure and at least one magnet. The planar suspension structure is tuned to cause oscillation of the at least one magnet at a resonance frequency based on a frequency of the time-varying magnetic field to generate electrical energy in the wireless power receiver.

20 Claims, 13 Drawing Sheets

(a) Silicon wafer
 (b) Wafer etching
 (c) NdFeB magnets
 (d) Demagnetization
 (e) Magnet assembly
 (f) Magnet magnetization
 (g) Coil fabrication
 (h) Coil assembly

ELECTRODYNAMIC WIRELESS POWER RECEIVER

CROSS-REFERENCE TO RELATED APPLICATIONS

This application claims the benefit of and priority to each of the following, and is a continuation-in-part of International Application No. PCT/US2019/027859, filed Apr. 17, 2019, which claims the benefit of and priority to U.S. Provisional Application No. 62/673,350, filed May 18, 2018, each of which are hereby incorporated herein by reference in their entireties.

STATEMENT REGARDING FEDERALLY SPONSORED RESEARCH OR DEVELOPMENT

This invention was made with government support under contract number 1439644 awarded by the National Science Foundation. The government has certain rights in the invention.

BACKGROUND

Wireless power transmission can be achieved by transmitting energy using electromagnetic fields. A transmitter can create a time-varying electromagnetic field. A receiver can be affected by the time-varying electromagnetic field, and a voltage and current can be induced in a receiver circuit.

One objective for wireless power transmission is to achieve high efficiency, high power transmission to small power receivers at long distances. Technologies for wireless power transmission can vary in the distance for efficient power transfer, and can involve different types of energy such as magnetic fields, electric fields, radio waves, microwaves, acoustic waves, infrared light waves, or visible light waves. Electromagnetic wireless power transmission approaches can be generally divided into near-field approaches and far-field approaches. Near-field approaches rely on non-propagating electromagnetic fields, and the receiver is generally within a distance to the transmitter that is less than one electromagnetic wavelength. Far-field approaches rely on propagating electromagnetic fields or other energies and the receiver is generally more than several wavelengths from the transmitter.

Inductive coupling between a coil in the transmitter and a coil in the receiver is commonly used for near-field wireless power transmission. Inductive coupling is well suited for close-range transmission, but efficiency can decay quickly with the distance. Magnetic resonance inductive wireless power transmission tries to increase distance, but the system architecture is more complex because it utilizes precise tuning between the transmitter and receiver for efficient power transfer.

Additionally, there are both practical and safety concerns about the electromagnetic fields that exist between the transmitter and receiver in some wireless power transmission systems. For example, an object that sits between the transmitter and receiver can be subjected to relatively strong magnetic fields with frequencies that can range from 100's of kHz to 10 MHz. At these frequencies, unwanted eddy currents can be generated in electrically conductive objects. Further, these eddy currents can attenuate or alter the fields used for power transmission, causing inefficiencies. In addition, these eddy currents can cause undesirable or even unsafe heating in the intervening objects. One solution is to shut off the power transfer when an object comes between the transmitter and receiver, or when other anomalies are detected. However, this solution can cause inefficiency or interruption of power transfer and adds additional complexity to the wireless transmission system for detection of objects.

BRIEF DESCRIPTION OF THE DRAWINGS

Many aspects of the present disclosure are better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

Figure 1:
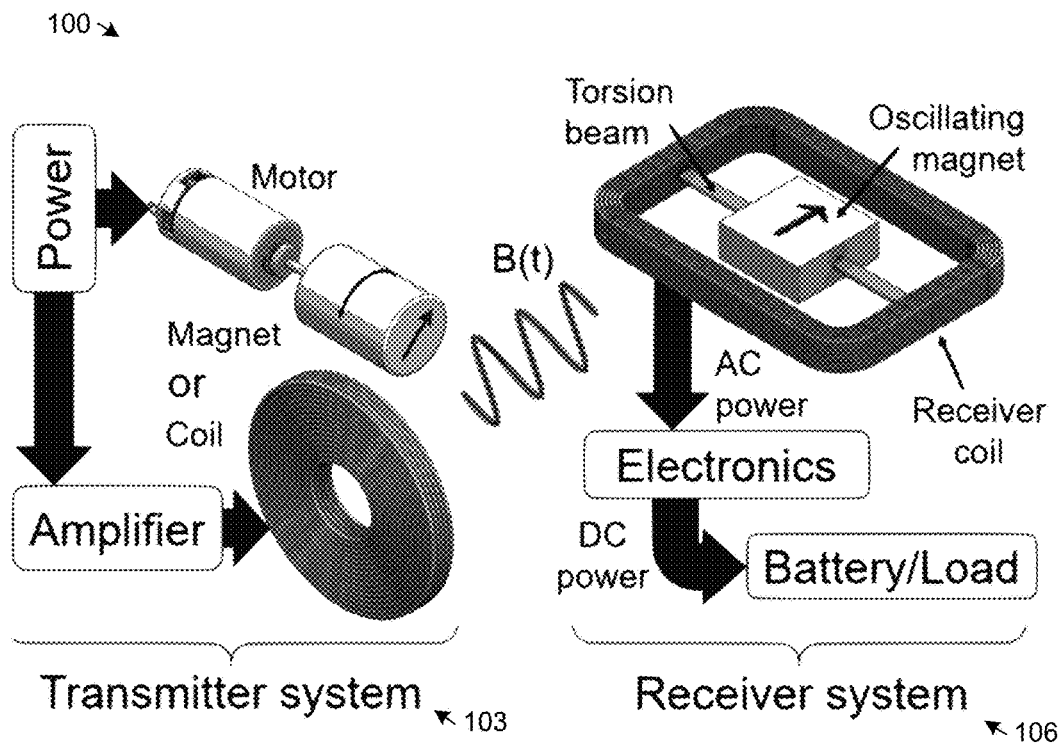
FIG. 1 illustrates an example electrodynamic wireless power transmission (EWPT) system according to the present disclosure.

Systems and methods for electrodynamic wireless power receivers are described herein. In one example embodiment, an electrodynamic wireless power transfer system includes a transmitter that generates a magnetic field, and a receiver that converts energy from the magnetic field by electromechanical conversion. The receiver includes a suspension structure, and at least one magnet. The suspension structure is tuned to cause oscillation of the at least one magnet at a resonance frequency based on a frequency of the magnetic field and generates a voltage in the receiver. The at least one magnet is attached to the platform.

The structure can be a silicon structure, or other semiconductor materials. The structure can alternatively be metal (such as steel, stainless steel, spring steel, or other common metals), ceramic (such as glass or other common ceramics), or a polymer (such as polycarbonate, polymethylmethacrylate, elastomers, or other suitable polymers). The structure may be fabricated by conventional machining, microfabrication, micromachining, or laser machining. The structure may be batch-fabricated with other structures to reduce the manufacturing costs.

The oscillation can include a torsional oscillation about an axis, where a direction of magnetization of the at least one magnet is orthogonal to the axis, and the receiver coil comprises a conductor that is substantially parallel to the planar suspension.

In some cases, the receiver includes a receiver coil, and the oscillation of the magnet induces electrical energy in the receiver coil. The planar suspension can include a layer of piezoelectric material. Oscillation of the magnet can produce electrical energy in the layer of piezoelectric material of the suspension. The planar suspension can be, for example, serpentine in shape to minimize the receiver volume while enabling a relatively low mechanical resonance frequency. Other suitable shapes can also be utilized. The oscillation can include a torsional oscillation about an axis, where a longest member of the serpentine shape is parallel to the axis. The oscillation can also include a translational oscillation orthogonal to the axis.

In another example embodiment, a wireless power receiver for electromechanical conversion of energy from a magnetic field includes a planar suspension structure and at least one magnet. The suspension is tuned to cause oscillation of the at least one magnet at a resonance frequency based on a frequency of the magnetic field, and the oscillation of the at least one magnet generates electrical energy in the receiver.

The suspension can further include a piezoelectric material, and oscillation of the magnet can produce electrical energy using the piezoelectric material. The suspension can include a meander suspension. The oscillation can include a torsional oscillation about an axis. The oscillation can additionally or alternatively include a translational oscillation.

In another example embodiment, a method includes converting energy from a magnetic field to electrical energy in a receiver coil by electromechanical conversion using a receiver comprising: the receiver coil, a frame, a platform, a planar suspension that connects the frame to the platform, and at least one magnet attached to the platform. A shape of the planar suspension causes oscillation of the at least one magnet at a resonance frequency based on a frequency of the magnetic field to induce the electrical energy in the receiver coil.

The magnetic field can be generated using a transmitter coil. The platform can include a magnet alignment structure that secures the at least one magnet using mechanical interference and glue. The frame, the platform, and the planar suspension can be aligned in a plane of a continuous planar structure. The oscillation can include a torsional oscillation about an axis, and a longest member of the planar suspension can be perpendicular to the axis.

An electrodynamic wireless power receiver can be part of an electrodynamic wireless power transmission (EWPT) system and can be referred to as an EWPT receiver. The EWPT systems differ from inductively coupled wireless power transmission systems by employing low-frequency (for example, frequencies less than or equal to 1 kHz) magnetic fields to deliver power by imparting torques or forces on a magnet in the receiver. Power can be delivered to multiple compact receivers over a distance up to tens of centimeters in a cluttered environment. The EWPT systems can minimize safety concerns and inefficiencies of RF wireless power transmission systems. The present disclosure describes the design, modeling, fabrication, and other aspects of microfabricated electrodynamic wireless power receivers that can be used for EWPT systems.

The present disclosure offers a solution for transmission to compact receivers at distances ranging from 1 cm to more than 1 m, as can be useful for Internet of Things (IoT) devices, wearables, underwater applications, or biomedical implants. In EWPT, the magnetic fields from a transmitter are used to excite the mechanical motion of a permanent magnet in the receiver. Frequencies for EWPT can be under 1 kHz and can be lower than frequencies for inductive or magnetic resonance methods. This mechanical motion can be converted into electricity by one or more electromechanical transduction schemes. The lower frequency of EWPT can be desirable for some applications. The EWPT method of the present disclosure can utilize a mechanically resonating permanent magnet embedded in the receiver. In some embodiments, the resonating permanent magnet can induce electrical energy (e.g., a current and/or a voltage) in a coil. The resonating permanent magnet can also impart mechanical stresses in a piezoelectric material so as to create a voltage, or otherwise produce electrical energy through the piezoelectric effect. The electrical energy from magnetic induction and the piezoelectric effect can be transferred to a device such as an IoT device, a wearable device, a biomedical implant device, or an underwater device. A device that is sealed, for example, a waterproof device, dustproof device, or hermetically sealed device can be powered.

One example can include a chip-scale microfabricated EWPT receiver that can output 2.5 mW of power under a 744 Hz, 550 $\mu T_{pk}$ AC magnetic field (equivalent to 20 cm transmission distance). Compared to some previous technologies, the microfabricated device can be 14.5× smaller (0.55 cm$^3$ vs. 8 cm$^3$) and can offer a 2.1× increase in power density (4.6 mW/cm$^3$ vs. 2.2 mW/cm$^3$).

In some embodiments, a wireless power transfer system can include a transmitter that generates a magnetic field and a receiver that converts energy from the magnetic field by electromechanical conversion. The receiver can include a silicon (or other appropriate material) suspension. The receiver can also include at least one magnet attached to the platform and a receiver coil. The at least one magnet can be attached to the platform. A shape of the suspension can be tuned to cause oscillation of the at least one magnet at a resonance frequency based on a frequency of the magnetic field, and oscillation of the at least one magnet can generate electrical energy in the receiver by electromechanical conversion techniques. For example, by inducing electrical energy in the receiver coil based on the oscillation, or by converting a motion of the piezoelectric material into electrical energy.

In some cases, the platform can include a magnet alignment structure that secures or holds the at least one magnet. The magnet alignment structure can secure the at least one magnet using mechanical interference, glue, epoxy, or a combination of methods. The alignment structure can include an indent or hole through the platform. The alignment structure can secure an alignment of the at least one magnet that allows or maximizes induction of electrical energy in the receiver coil, and can prevent the at least one magnet from rubbing, striking, or contacting the receiver coil during oscillation.

The platform can also include alignment magnets. The alignment magnets can cause the at least one magnet to self-align in place on the platform and can temporarily hold the at least one magnet in place on the platform magnetically until the at least one magnet is secured permanently using mechanical interference, glue, epoxy, or another method. The alignment magnets can temporarily align the at least one magnet in a position that allows or maximizes induction of electrical energy in the receiver coil, and can prevent the at least one magnet from rubbing, striking, or contacting the receiver coil during oscillation. In some cases, the alignment magnets can align the at least one magnet with the alignment structure.

In some cases, the structure can be a continuous planar structure, and the frame, the platform, and the suspension can be aligned in a plane of the continuous planar structure. In some cases, the structure can include a silicon material. In some cases, the structure can include a metal material. In some cases, the structure can include a polymer material. Any of these materials can be a substrate that is microfabricated to form the suspension structure, for example, through an additive or subtractive process.

In some embodiments, a portion of the structure, for example, the suspension, the frame, or the platform, can include a layer or section of piezoelectric material, and oscillation of the magnet produces electrical energy using the piezoelectric material. In some cases, the suspension, the frame, or the platform can include, be coated with, or be formed of piezoelectric material.

In some embodiments, the shape of the suspension can include a serpentine or meander shape. The oscillation can include a torsional oscillation about an axis, and a longest member of the serpentine shape can be parallel to the axis. In some cases, the oscillation is only torsional, and in other cases the oscillation can include a translational oscillation, and the translational oscillation can be orthogonal to the axis.

As shown in FIG. 1, an EWPT system 100 can include a transmitter system 103 and a receiver system 106. The EWPT system 100 shows an example architecture for electrodynamic wireless power transfer. The mechanically resonating magnet is sensitive to the time-varying magnetic field from the transmitter and can generate power in the receiver coil. An AC magnetic field (e.g., B(t)) generated by the transmitter system 103 couples via a torque with the oscillating magnet of the receiver system 106, which can torsionally oscillate about an axis (e.g., about the torsion beam). The magnet oscillation can additionally or alternatively include vertical or horizontal translation. While oscillating, the magnet can change the magnetic flux in the receiver coil and can generate an AC voltage by induction. The receiver coil can be connected to suitable power electronics to obtain a regulated DC voltage to charge a battery or directly supply a system.

The EWPT method operates at low frequency (10-1000 Hz) while maintaining a valuable power density. Considering a voltage V induced in the receiver coil, which is proportional to the time-rate-change of the flux $d\Phi/dt$, the reduction in voltage due to the low operational frequency can be counterbalanced in EWPT by a larger magnetic flux (and consequently flux change) produced by the mechanically moving permanent magnet. Furthermore, the lower frequency EWPT approach can safely operate with higher magnetic field strengths, since the admissible magnetic field strength for safe exposure of humans can be higher when lower frequencies are utilized. In addition, the low frequency of operation can mitigate the field attenuation and parasitic heating effects as compared with RF fields. This makes EWPT suitable for transmitting power to multiple receivers in an environment crowded and cluttered with metallic objects such as a home, office, or automobile environment, or for powering safely deep biomedical-implants or wearables through the human body.

The present disclosure describes a significantly miniaturized receiver that can utilize micromachined silicon suspensions or can utilize other microfabricated substrates including semiconductors, metals, polymers, and other materials for suspensions. Silicon suspensions, as compared to other materials, have the potential to increase the resonant amplitude of the receiver, making it more responsive to lower magnetic fields, and therefore extending the power transmission distance. Silicon suspensions can have lower mechanical damping as compared to other materials.

Figure 2:
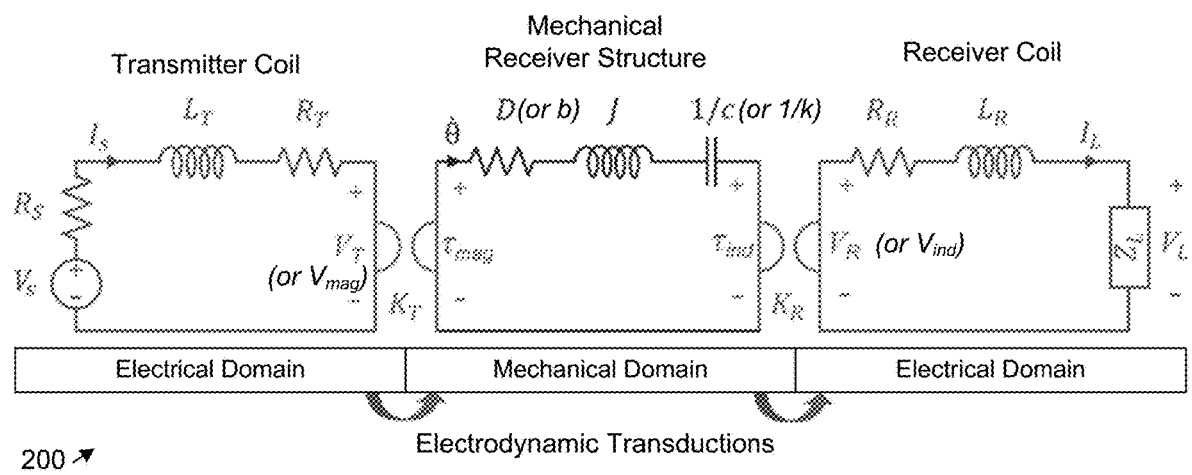
FIG. 2 illustrates an example equivalent electrical circuit of an EWPT system according to the present disclosure.

FIG. 2 illustrates an example equivalent electrical circuit 200 for an EWPT system. Energy from the source VS can flow from the electrical domain through the transmitter coil, to the mechanical domain via the spring-mass-damper, and then back to the electrical domain through the receiver coil and the load. The two transductions between the electrical and the mechanical domains can be achieved through electrodynamic coupling. The equivalent circuit can include the transmitter coil, the mechanical receiver structure, and the receiver coil. The transmitter coil can be modelled with a series R-L network ($R_T$ & $L_T$). Likewise, the receiver coil can be modelled with a series R-L network ($R_R$ & $L_R$). VS is the source voltage attached to the transmitting coil, and $Z_L$ is the load resistance attached to the receiving coil. The mechanical structure can be modelled using a mass-spring-damper system with mass m (kg), spring constant k (N/m), and viscous damping coefficient b (N·s/m). The electrodynamic coupling between each of the coils and the mechanical structure is modelled with two gyrators, having gyration ratios $K_T$ and $K_R$ (V·s/m) representing the transduction coefficients.

Figure 3:
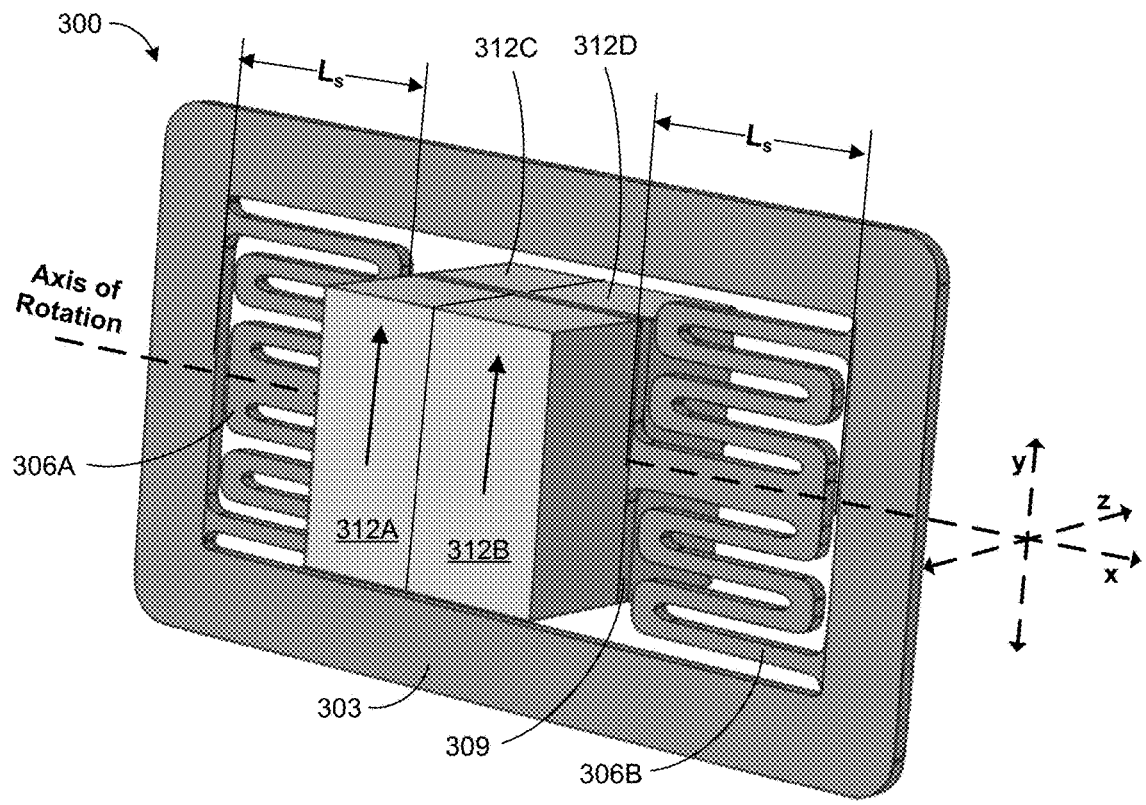
FIG. 3 illustrates an example EWPT receiver according to the present disclosure.

FIG. 3 illustrates an example EWPT receiver 300. The EWPT receiver 300 includes a microfabricated structure or suspension structure. A suspension structure can be formed of a microfabricated substrate including semiconductors, metals, polymers, and other materials, and can be referred to as a microfabricated substrate suspension structure. Metals used can include steel, stainless steel, spring steel, and titanium, among others. The microfabricated structure can be planar as shown. In some cases, the microfabricated structure can include a planar or otherwise microfabricated structure of a particular material such as silicon or another material as discussed. An additive or subtractive microfabrication process can result in a planar structure that can include a single or continuous piece of a particular material. In some cases, the planar structure can include multiple separately constructed elements, or elements constructed through different process steps and attached together. The microfabricated suspension structure can include a frame 303, a suspension including suspensions 306A and 306B, and a magnet platform 309. The suspension can include a first suspension 306A and a second suspension 306B. The suspensions 306A and 306B can connect the frame 303 to the magnet platform 309. The suspensions 306A and 306B can each have a suspension length Ls. The suspension length Ls can be optimized depending on the particular shape or design of the suspension.

Magnets 312A and 312B can be attached to a first side of the magnet platform 309. Magnets 312A and 312B can alternatively be a single magnet. Each of the magnets can be magnetized in the direction shown by the arrows, in other words, orthogonal to the frame 303, for example, so that the magnetization is orthogonal to a coil around the magnets, where the coil is along the frame 303 and a conductor of the coil is wound substantially parallel to the suspension and the frame 303. Substantially parallel can indicate parallel within a threshold or tolerance angle from parallel, such as within 5 degrees from parallel (e.g., 1°, 2°, 3°, 4°, or 5° from parallel). A conductor can be wound along the frame 303 and be built up on itself in the Z direction to form a coil or spiral shape that surrounds the magnets. The conductor of the coil can be orthogonal to the magnetization of the magnets at a position or positions (e.g., at opposite sides) of minimum separation between the magnets and the coil. Because the coil surrounds the magnets, at other positions, the magnetization can be parallel or at other angles relative to the coil conductor. The direction of magnetization can also be orthogonal to an axis of rotation of the suspension.

Magnets 312C and 312D can be attached to a second side of the magnet platform 309 opposite the first side and the magnets 312A and 312B and can also be magnetized in the direction shown. Magnets 312C and 312D can alternatively be a single magnet. Moreover, there can be any number of magnets attached to each side of the magnet platform 309 from one magnet on each side to many magnets on each side of the magnet platform 309.

The magnets 312A-D (the magnets 312) can be attached to the magnet platform 309 using at least one of glue, epoxy, mechanical interference, and other techniques. The magnets 312 can also be formed by metallization on the magnet platform 309, and thereby be attached to the magnet platform 309. The magnets 312 can be any type of magnet, including neodymium, neodymium iron boron (NdFeB), samarium cobalt (SmCo), alnico, ceramic, or ferrite magnets.

Two receiver coils (not shown) can be attached to the frame 303. For example, a first receiver coil can be attached to a first side of the frame 303 and can encircle or surround magnets 312A and 312B in a spiral or helical shape that traces the shape of the frame 303 and builds in the z direction. A second receiver coil can be attached to a second side of the frame 303 and can encircle or surround magnets 312C and 312D in a spiral or helical shape that traces the shape of the frame 303 and builds in the z direction. Each coil can be made of metal winding, magnet wire, or enameled wire, such as copper, aluminum or other suitable material, and can include thin insulation such as polymer film insulation. The first receiver coil and second receiver coil can optionally be electrically connected in parallel or series.

The suspensions 306A and 306B can be optimized to be compact, for example, in the $L_s$ dimension about the axis of rotation. In some examples, suspensions 306A and 306B can allow only one degree of freedom around the axis of rotation, while setting the resonant frequency of the resonator through their rotational stiffness and allowing a rotation of the magnet (e.g., ±20°). The length of the suspension $L_s$ can be optimized to be as small as possible to minimize the receiver volume (i.e. increase power density) and to minimize the wiring far from the magnets where the fields are weaker (i.e. lower coil resistance leads to higher power). The resonant frequency can be tuned or designed through physical characteristics of the structure and the suspension including its shape and material characteristics. The resonant frequency can be tuned for optimal power coupling with a time-varying magnetic field of a transmitter coil. In some cases, the resonant frequency of the structure can be tuned to match a frequency of the time-varying magnetic field of a transmitter coil. For example, the resonant frequency of the structure and the frequency of the time-varying field can be designed to be within a threshold difference from each other, such as within 5%, 10%, 15%, 20%, or 25%. In other examples, the resonant frequency of the structure can be designed to be within a threshold difference, such as within 5%, 10%, 15%, 20%, or 25% from a multiple of, or a fraction of, the frequency of the time-varying field.

Magnet platform 309 can be designed to hold the magnets 312. In some cases, the magnet platform 309 can be the shape of the magnets 312 that will be attached to or held in place by the magnet platform 309. The magnets can be held in place using glue or epoxy or other methods. In some cases, the magnet platform 309 can include alignment magnets at various positions on the magnet platform 309, which can be used for magnetic alignment of magnets 312. The alignment magnets can cause the magnets 312 to self-align on the magnet platform 309 during the fabrication process.

Magnet platform 309 can also include a magnet alignment structure or structures into which the magnets 312 can be aligned by being placed or held securely within the magnet alignment structures by interference fit or mechanical interference. For example, a magnet alignment structure can include dents partially through the platform or a hole completely through the platform, which can form a frame around one or more of the magnets 312. In some cases, the dents or holes can be sufficient to hold the magnets 312 in place. In other cases, the dents or holes can be used for proper positioning while glue, epoxy, or another method is utilized to secure the magnets 312 in place.

The microfabricated structure, including the frame 303, suspensions 306A and 306B, and the magnet platform 309, can be formed using an additive or subtractive microfabrication process. For example, the microfabricated structure can be 3D printed in an additive process. Alternatively, the microfabricated structure can be chemical etched, such as through deep reactive-ion etching (DRIE), laser machining, or other techniques in a subtractive process.

In some examples, electromechanical conversion can include a combination of one or more conversion methods, including electrodynamic and piezoelectric conversion. The microfabricated structure, or a portion of the microfabricated structure, such as the suspensions 306, can be formed using a piezoelectric material or can include a piezoelectric layer or patch. When the magnets 312 oscillate, whether the oscillation is torsional or translational, the piezoelectric material, layer, or patch can convert the motion into electrical energy. This can be used additionally to or alternatively to the receiver coils.

Figure 4:
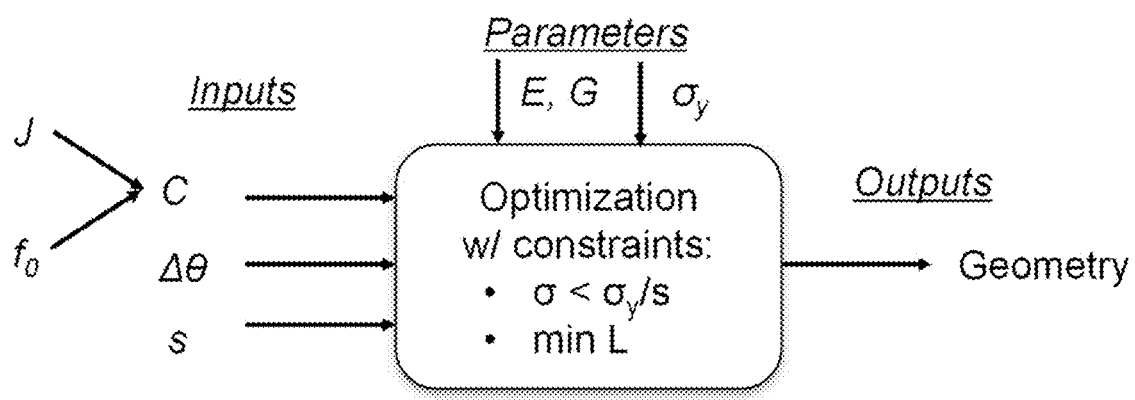
FIG. 4 illustrates example design characteristics for suspension components of an EWPT receiver according to the present disclosure.

FIG. 4 illustrates example design characteristics for suspension components of an electrodynamic wireless power receiver. The inputs and parameters can include those shown, as well as the size of the magnet (depending on available magnets, which can be a limited set of commercially available magnets), the desired resonant frequency, the maximal rotation amplitude of the magnet, and the wafer thickness and mechanical properties (Young's modulus and Poisson's ratio). The optimization should consider several other constraints and design objectives. The mechanical suspensions can be compliant in the desired mode, such as rotation only (e.g., about the axis of rotation), translation only (e.g., in the z direction, x direction, or y direction), or both rotation and translation. The design can also reject other vibration modes around the frequency of interest. The stress at the maximum rotation amplitude can be optimized to be lower than the yield stress adjusted by a multiplicative safety coefficient (chosen here as 0.2), and the suspension length $L_s$ can be minimized.

Figure 5:
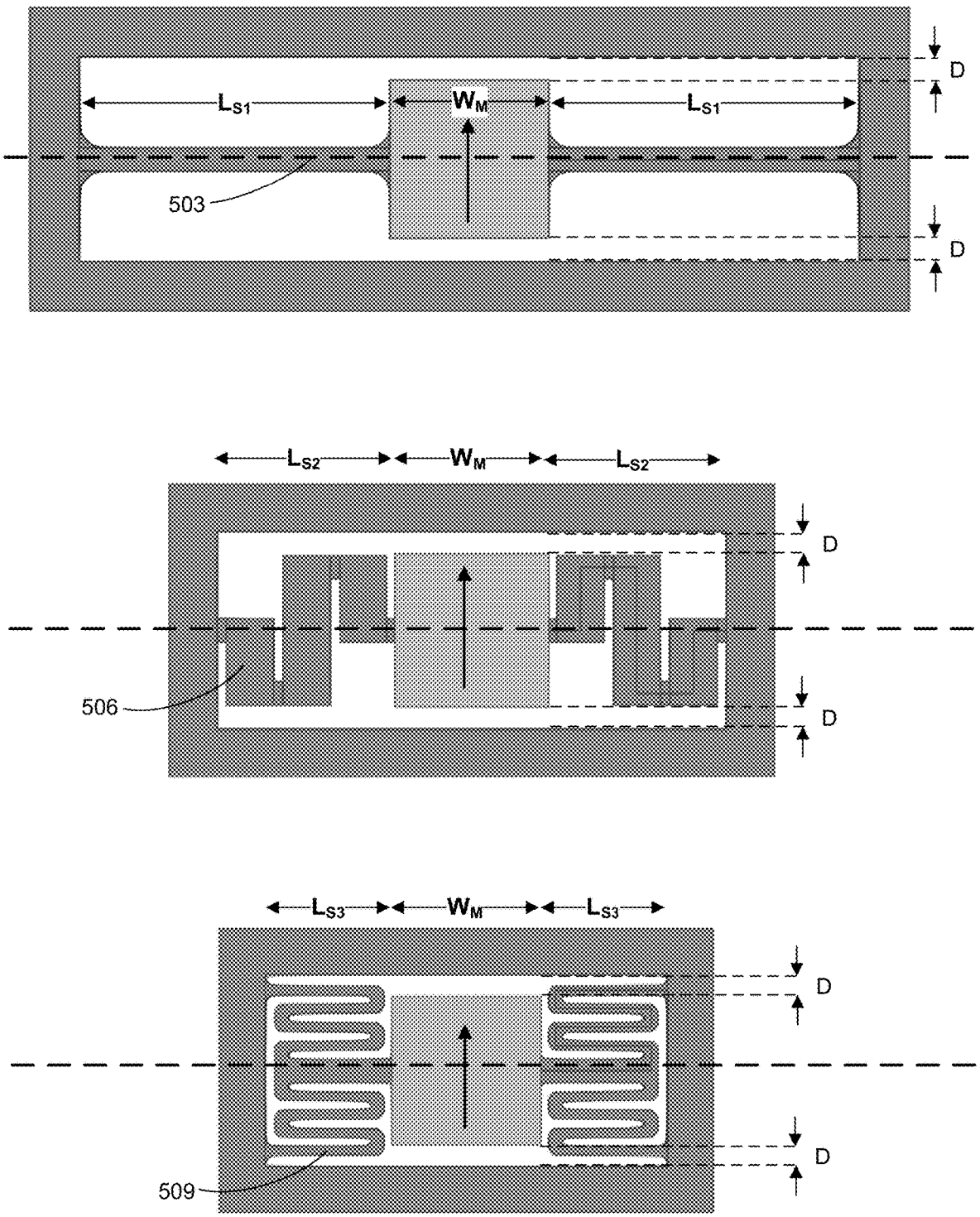
FIG. 5 illustrates example suspension designs for EWPT receivers according to the present disclosure.

FIG. 5 illustrates example suspension designs 503, 506, and 509 for electrodynamic wireless power receivers. In the example of FIG. 5, the three oscillators with the respective suspension designs 503, 506, and 509 can use the same magnet assembly (two 1/8"×1/8"×1/16" magnets) and can resonate at the same frequency around 1 kHz. In addition, the closest distance D between the magnets and the coil can be equal in each oscillator. The magnet width WM along the closest distance D between the magnets and the coil is equal in each oscillator. The challenge is to find an appropriate trade-off between a compliant enough structure with the right stiffness for the targeted frequency by changing the beam width and length, as well as the number of meanders when appropriate.

A conductor can be wound along the frame and can be built up on itself to form a coil or spiral shape that surrounds the magnet(s). The conductor of the coil can be orthogonal to the magnetization of the magnets at a position or positions of minimum separation between the magnets and the coil, for example, at opposite sides where the distance between the magnets and the coil is the closest distance D. Because the coil surrounds the magnets, at other positions the magnetization can be parallel or at other angles relative to the coil conductor, for example, at opposite sides where the distance between the magnet(s) and the coil is $L_{S1}$, $L_{S2}$, $L_{S3}$ in the respective examples shown. In addition, the direction of magnetization shown by the arrow can in each example can be orthogonal to an axis of rotation shown by the dashed line of each example.

Suspension 503 can include two simple torsional beams. Suspension 503 uses long beams to allow the targeted rotation amplitude. The suspension length of each side of the suspension 503 can be $L_{S1}$.

Suspension 506 can include two serpentine or meander beams with their main (e.g., longest) members being perpendicular to the axis of rotation. In suspension 506, meander beams can work mainly in flexural mode and can be much more compact, $L_{S2}$ being 1.76 times shorter than $L_{S1}$. The volume of the receiver using suspension 506 can be 1.5 times smaller than the receiver using suspension 503.

Suspension 509 can include two serpentine or meander beams with their main members parallel to the axis of rotation. In suspension 506, meander beams can work both in torsional and flexural mode. $L_{S3}$ is 2.36 times shorter than $L_{S1}$, and the volume is 1.77 times smaller than the configuration that uses suspension 503. The resonant frequency could be widely adjusted by changing the number of meanders. With more meanders, the more compliant structure resonates at lower frequency and the suspensions are shorter.

To maximize the generated power of the receiver coils, the coil winding should be as close as possible to the magnet without preventing its rotation. In other words, the distance D can be minimized to maximize generated power. Moreover, the resistivity of the wire material should be preferably the lowest possible. Copper wire can provide an appropriate resistivity. The wire gauge does not significantly affect the generated power, meaning that a device with a large number of turns of thin wire can produce substantially the same amount of power as a device using fewer number of turns of a thicker wire. However, it can be preferred to use a small wire diameter (i.e. more turns for a given volume) to obtain a significant enough voltage to simplify the voltage regulation electronics.

Figure 6:
FIG. 6 illustrates an example fabrication process for EWPT receivers according to the present disclosure.
Figure 6:
Figure 6:
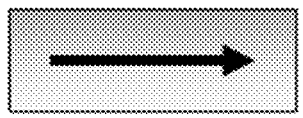
Figure 6:
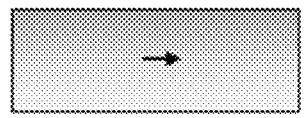
Figure 6:
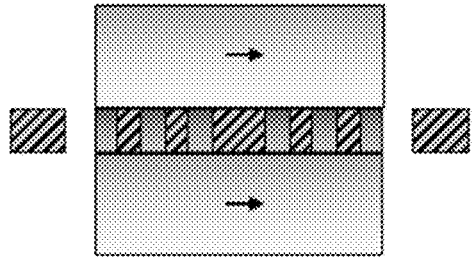
Figure 6:
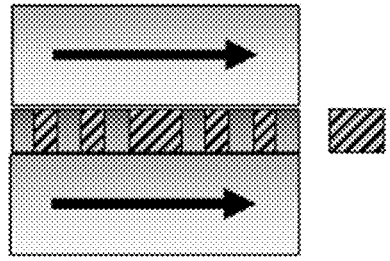
Figure 6:
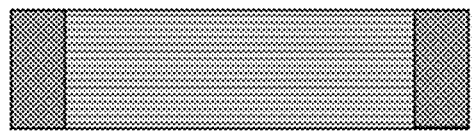
Figure 6:
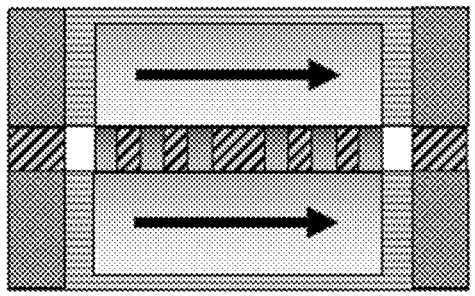

FIG. 6 illustrates an example fabrication process for electrodynamic wireless power receivers. In FIG. 6, the fabrication process shown can be used to fabricate the EWPT receiver 300 of FIG. 3. For example, in (a) the process can start with a silicon wafer, or another semiconductor, metal, polymer, or other substrate or material. In (b) the process can include through-etching or otherwise forming a microfabricated structure including a frame, serpentine torsion beams, and a platform. For example, the microfabricated structure can be formed by through-etching via DRIE a 200-μm-thick double-side-polished silicon wafer, using photoresist, such as a 6-μm thick photoresist. In some cases, 50 structures can fit on a 100 mm wafer. The structures can be released during the same operation by etching the surrounding of their frames.

In (c)-(f), the magnets can be assembled in the structures. Any magnet material can be utilized. In one example, the magnets can include four Nd—Fe—B 1/8"×1/16"×1/16," e.g., one for each of the magnets 312 of FIG. 3. Since their magnetizations all point in the same direction, it can be difficult to accurately position the magnet on the platform because the magnets repel each other. As indicated in (d), one solution can be to demagnetize the magnets, for example, by using a pulse magnetizer. In (e), the magnets can be assembled on the silicon platform (e.g., two on top and two on bottom as in FIG. 3). The magnets can be glued on the platform. In (f), the magnets can be re-magnetized once the magnets are securely in place. The re-magnetization can be performed using a pulse magnetizer. Alternatively, the magnets can be metallized in place on the silicon platform and then magnetized, for example, using a pulse magnetizer or another method.

In (g), the two receiver coils can be formed. In some examples, each receiver coil can be AWG 40, 150 turns each, ~17Ω each. The receiver coil can be wound on a sacrificial foam jig and glued to maintain its form. In (h), the coils can be assembled on the silicon frame and connected in series. In some examples, the fabricated device can be 10.8×6.1× 8.3 mm³ (0.55 cm³, 0.75 g).

Figure 7A:
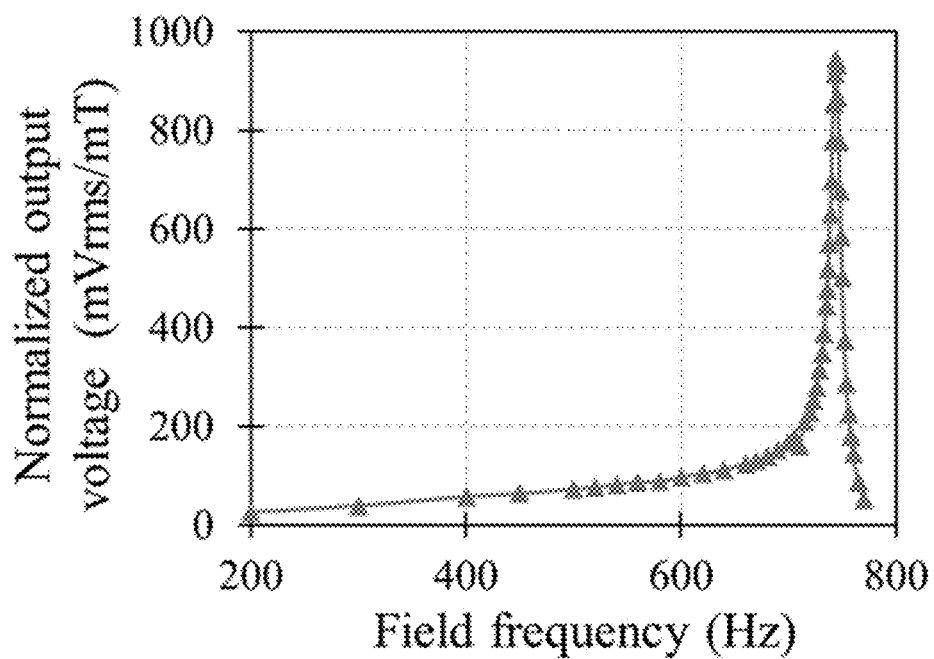
FIGS. 7A-7D are example graphs that illustrate performance characteristics of an example EWPT receiver according to the present disclosure.
Figure 7B:
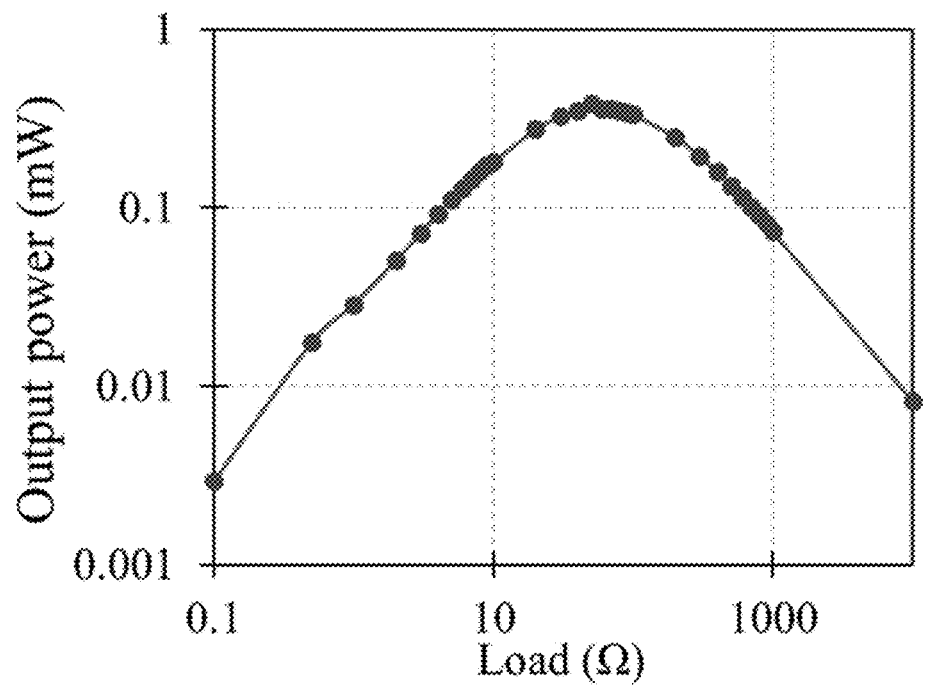
Figure 7C:
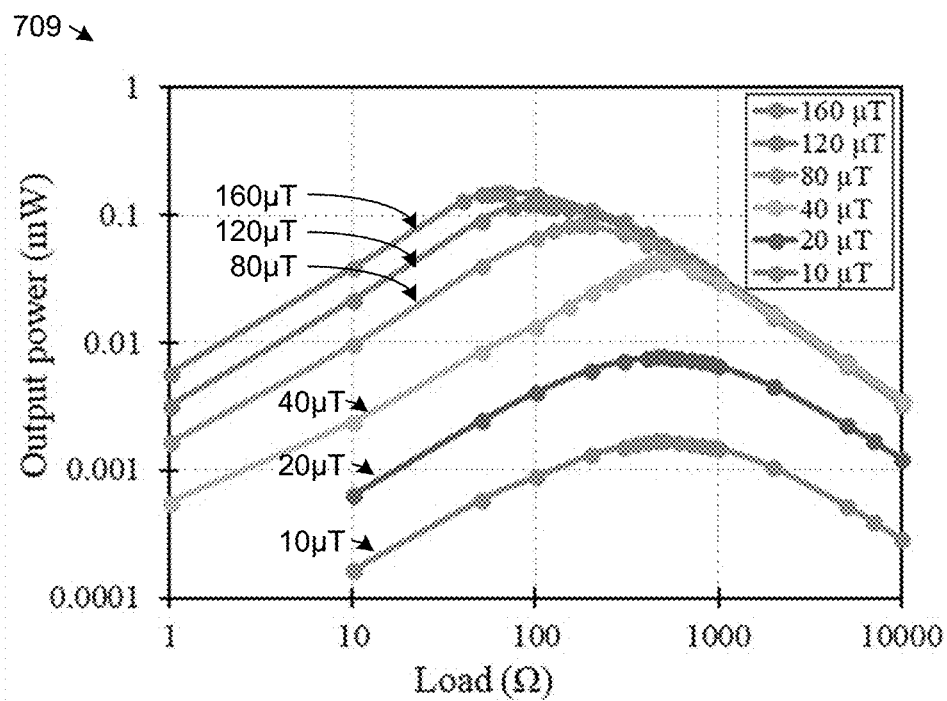
Figure 7D:
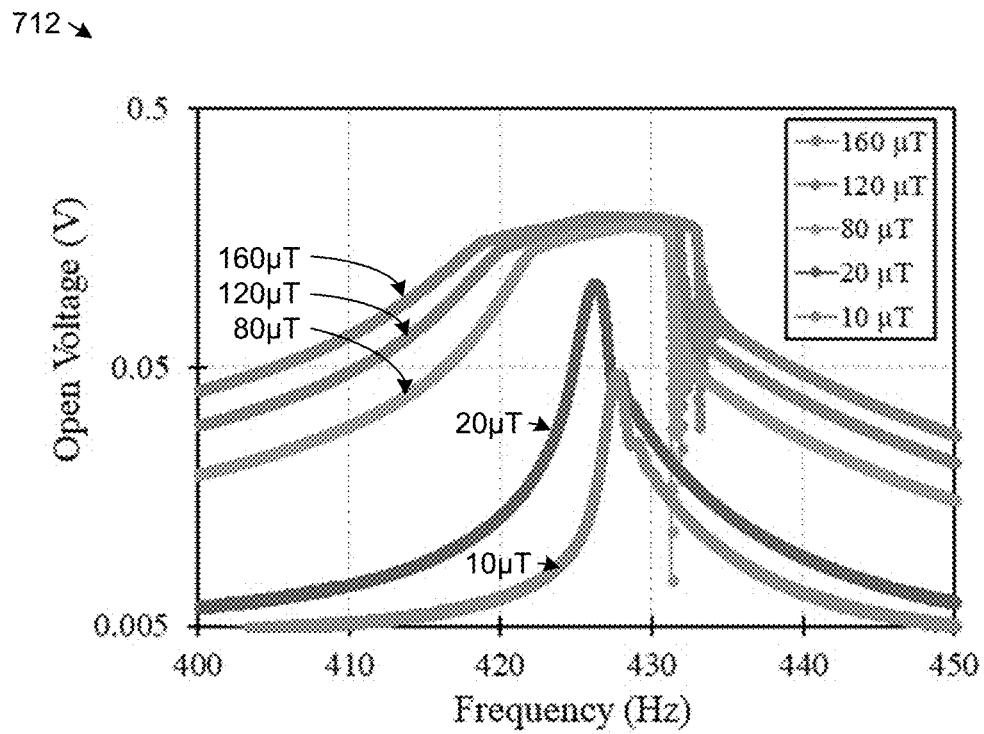

FIGS. 7A-7D illustrate example graphs 703, 706, 709, and 712 that illustrate performance characteristics of an example electrodynamic wireless power receiver. The results in FIGS. 7A and 7B are based on a receiver characterized using a Helmholtz coil pair (28-cm diameter, 15-cm long, 1.2Ω per coil, 0.74 mT/A). The Helmholtz coils are used in order to apply a purer (more spatially uniform and more controllable) magnetic field and without simultaneously applying a field gradient. For preliminary testing purposes, the receiver magnet is subjected to torque and minimal force.

Graph 703 presents normalized open voltage while varying excitation frequency from 200 to 780 Hz. The system presents a sharp peak, characteristic of an underdamped $2^{nd}$-order system (quality factor estimated to be 50). The maximum output, occurring at the resonant frequency of 744 Hz, is 0.95 $V_{rms}$/mT in the linear regime.

Graph 706 shows actual time-average output power delivered to a resistive load (varied from 0.1 to 2000Ω) while using a constant amplitude, 300 $\mu T_{pk}$ AC magnetic field. The power absorbed by the load can be low if its resistance is too low (low voltage) or is too high (low current) compared to the receiver coil resistance. In this case, an optimized load can be about 50Ω, expectedly close to the receiver coil resistance (34Ω). In various examples, the load can be optimized to be approximately the receiver coil resistance, within a range of receiver coil resistance +/−25%, receiver coil resistance +/−50%, or receiver coil resistance +/−75%.

Graphs 709 and 712 show results for various magnetic field amplitudes. For example, graph 709 shows output power as a function of load at various magnetic field amplitudes. Graph 712 shows open voltage as a function of frequency at various magnetic field amplitudes.

In another experiment, the field can be progressively increased to obtain the highest magnet rotation amplitude and highest power output. One experiment for an example receiver shows that at a 550 $\mu T_{pk}$ field, transmitted power can be 2.55 mW (0.59 $V_{rms}$ output). This magnetic field amplitude corresponds to a field produced at 20 cm by a 15-cm-radius coil supplied by 10 W input power. The power density of the receiver can be 4.6 mW/cm$^3$. This disclosure involves an EWPT system using a chip-sized partially microfabricated receiver. In some examples, 2.5 mW of power can be achieved using a 744 Hz magnetic field with an amplitude of 550 $\mu T_{pk}$, equivalent to a ~20 cm transmission distance for a typical 10 W transmitter coil. The microfabricated device is 14.5× smaller than some existing devices and can offer a 2.1× increase in power density (4.6 mW/cm$^3$) over some existing devices.

Aspects of the various embodiments can be described with respect to the following additional examples.

Figure 8:
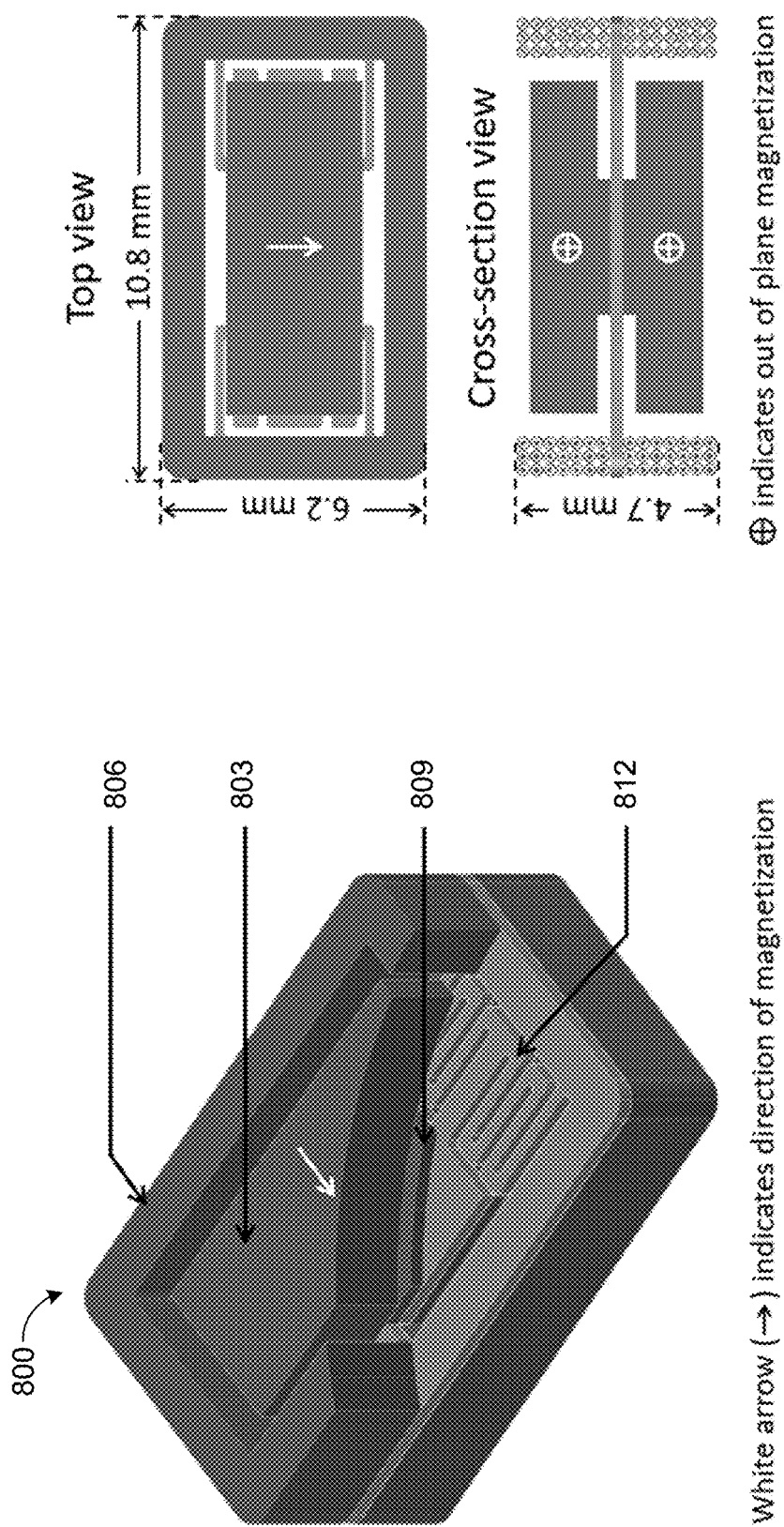
FIG. 8 illustrates an example EWPT receiver with a torsionally resonated center platform, according to the present disclosure.

FIG. 8 shows an example schematic structure of an EWPT receiver 800 with a torsionally resonated center platform supported by serpentine suspensions 812 to a surrounding frame. The design can use two magnets 803, one attached to each side of a center platform, to oscillate under the influence of an external time-varying magnetic field. Two rectangular-shaped coils 806 can be attached to both sides of a base frame with the coils 806 electrically connected in series. The magnet-coil-suspension structure can form a resonant electrodynamic transducer for power generation. To maximize performance, each magnet 803 can occupy an entire area, a majority of the area, or at least a portion of the area over the serpentine suspension 812 and can be magnetized along its lateral direction (perpendicular to the rotation axis). In other words, the magnet 803 can be larger than and extend beyond a perimeter of the center platform. A spacer 809 can be used on each side, between each magnet and the center platform, to allow clearance between the magnet 803 and the serpentine suspension 812 to enable torsional oscillation, in some cases without contacting and without obstructing the operation of the serpentine suspension 812. The vertical dimension or distance that the spacer 809 sets off the magnet 803 from the serpentine suspension 812 can be selected so as to prevent contacting the serpentine suspension 812 and/or to prevent obstructing the operation of the serpentine suspension 812.

Large magnets can result in: more effective use of the volume within the device that reduces the dead space; increased sensitivity to the external magnetic fields; and more magnetic flux linkage with the coils that results in stronger electrodynamic coupling. Because the two magnets 803 are mechanically fixed to the suspension (in some cases via the spacers 809) and can move together in conjunction with the suspension, in some cases the magnets 803 can be referred to in the singular. The two series connected coils 806 above and below the structure can be referred to as a singular coil 806.

Figure 9:
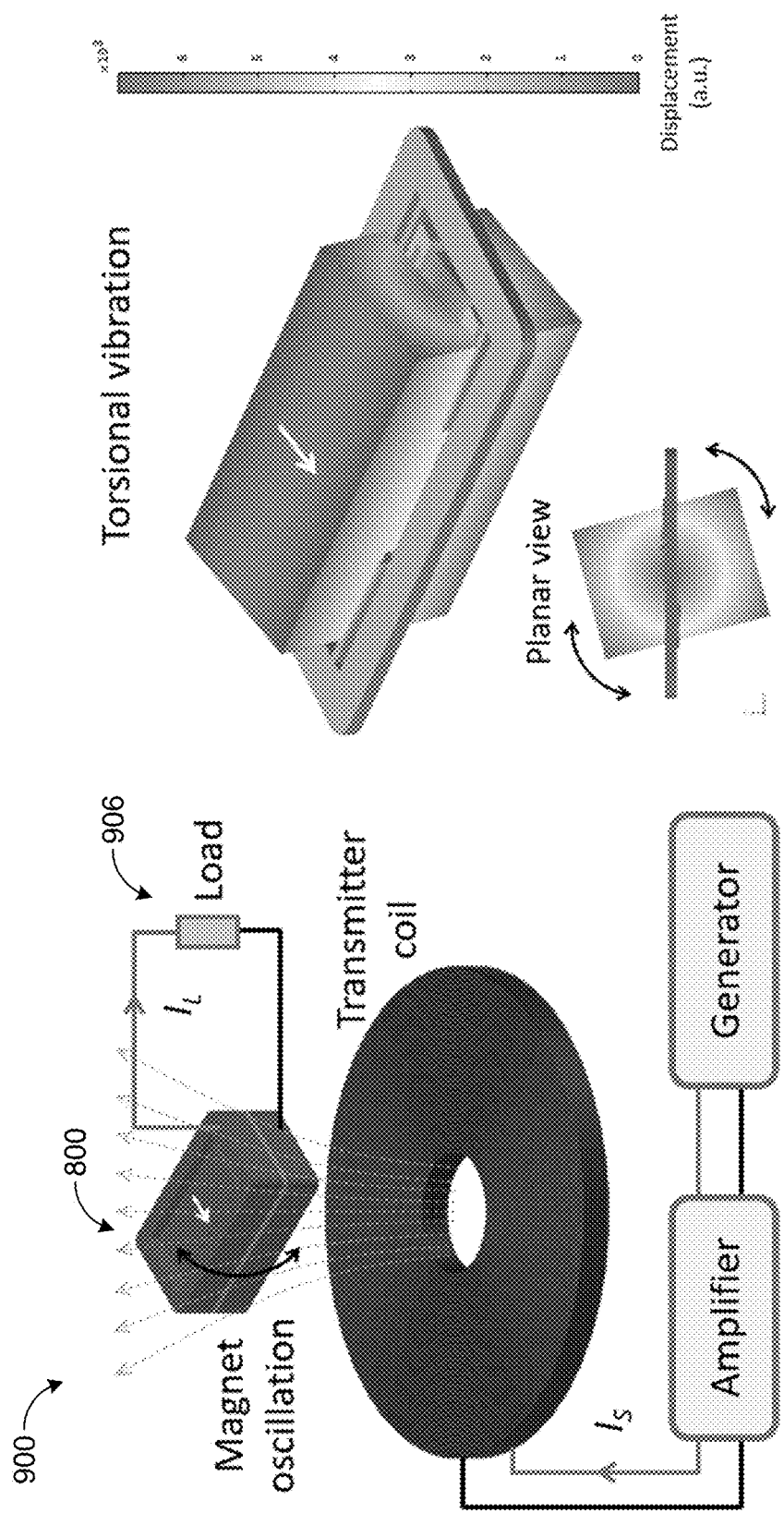
FIG. 9 illustrates an EWPT system using the EWPT receiver of FIG. 8, according to the present disclosure.

FIG. 9 shows an example EWPT system 900. This example can show principles of electrodynamic wireless power transmission with an EWPT receiver 800 and torsional vibration of the receiver magnets in response to the time-varying magnetic fields supplied by the transmitter coil.

An alternating current $I_S$ can be supplied to a transmitter coil in order to generate spatially distributed, time-varying magnetic field of desired frequency and amplitude. This field can induce a torsional oscillation of the magnet in the EWPT receiver 800, wherein the motion of the magnet induces voltage (technically an electromotive force, or emf) in the receiver coil via Faraday's law. Electrical current $I_L$ (and hence power) can be delivered to an external load 906 electrically coupled or connected to the receiver coil of the EWPT receiver 800. Maximum voltage and power generation can be achieved at torsional resonance of the mechanical suspension and also when the receiver magnet of the EWPT receiver 800 is oriented perpendicular to the magnetic field. Direct inductive coupling between the transmitter coil and the receiver coil can be negligible (very low mutual inductance) since the system can be designed to operate at low frequencies (<1 kHz).

While designing and optimizing the mechanical suspension structure, special care needs be taken to achieve large electrodynamic coupling. The following factors can be chosen and used as design inputs: size of the magnets, resonant frequency, maximum rotation amplitude of the magnets, and suspension thickness and its material properties (Young's modulus, Poisson's ratio etc.). Several other constraints and design objectives can include compact design with minimal suspension length and reduced volume; compliant mechanical suspensions of the desired vibration mode (here torsional rotation), while avoiding other spurious modes around the resonant frequency of interest; stress on the mechanical suspension at the maximum rotation amplitude to be lower than its yield stress. Various torsional suspension architectures (e.g., simple torsional beams, meander beams, and serpentine beams) with the beam axis parallel to the axis of rotation can be used. This can provide a compact footprint, and large torsional rotation (up to ±11°) of the magnets can be achieved while keeping stresses well below the yield limit of silicon.

Resonance behavior can be modeled by 3D finite element analysis (FEA) simulation using appropriate software packages. The compliant epoxy adhesive layer-bonding the magnets and spacers to the meandering suspension—can be simulated via a 20-µm-thick elastic layer condition with the following properties: Young's modulus E=2 GPa and Poisson's ratio v=0.25. These simulations can show that the first mode of vibration can be at 820 Hz, corresponding to the torsional rotation along the axis of rotation; the second and third mode of vibration correspond to the bending and lateral displacement, at 1073 Hz and 1300 Hz, respectively. The frequency response for the torsional rotation of the receiver about the x-axis using a damping ratio ζ=0.003 corresponding to a Q-factor of 165. No peaks are observed for bending (at 1073 Hz) and lateral displacement (at 1300 Hz) modes since only torsional oscillation occurs in this example due to the nature of interaction between the proof mass (magnets) and the input excitation (torque generated by alternating magnetic fields). To assess the peaks at 1073 Hz and 1300 Hz, other approaches can be used.

In order to characterize the mechanical reliability, simulations can be performed for various magnetic field amplitude excitations at resonance. Two mechanical limits can be considered: 1) the maximum rotation angle at which the magnets make contact with the coil (±11° for the design here) and 2) the maximum rotation angle before the beams may fail due to stress. Considering the brittleness of silicon, it is assumed catastrophic failure would occur whenever the largest principal normal stress exceeds the ultimate tensile strength of silicon (assumed to be $\sigma_{UT}$=165 MPa). The distribution of the first and third principal stresses ($\sigma_1$ and $\sigma_3$) on the suspension base at the maximum torsional rotation can be considered.

Maximum first principal stress vs. rotation angle can be considered as well. The magnets can interfere with the coil before exceeding a stress-related failure limit. The maximum stress can vary linearly with the rotational angle, however, a semi-log plot can be used to aesthetically show the operational, failure and unreachable zones. In some examples, at the maximum rotation angle of ±11°, the maximum stress can be about 6.7 MPa, well below the failure limit for silicon.

Once the mechanical suspension is successfully designed, another element in the design procedure to be considered can be the transducer: an electrodynamic transducer, in this case. Since the magnetic moment $\vec{m}$ of a permanent magnet depends on its volume $v_{mag}$, a larger permanent magnet can be desirable in order to facilitate the flux linkage with the receiver coil, under a given magnetic field generated by the transmitter. Additionally, a perfectly wound receiver coil placed as close as possible to the magnet (but magnet-coil airgap should be selected so that it does not prevent the magnet's torsional rotation). This strengthens the electrodynamic coupling and the overall device performance. Some examples include a 0.5 mm magnet-coil air gap that leaves adequate clearance for ±11° rotation of the magnet. To first order, the wire gauge does not significantly affect the generated power; however, a small wire diameter (more turns for a given volume) can be utilized to obtain larger voltages (lower currents) to ease the system-level voltage rectification and power management challenges. For example, a fine 44 AWG (American wire gauge) magnet wire can be chosen for ease of handling/manufacturing. The wire can be wound into 498-turn (or other) rectangular coils that fill the 8.8× 4.2×2.2 mm³ (or other) volume around the magnet but maintain a selected magnet-coil clearance.

The following discussion is applicable to the receivers of FIGS. 3, 5, and 8 as can be understood. The multi-energy-domain system can be modeled using a lumped element modeling approach as in FIG. 2. This approach can facilitate physics-based understanding of the system dependencies, as well as modeling the behavior of the system using ordinary differential equations (specifically here the time-harmonic steady-state behavior represented as an equivalent circuit and solved using ac circuit analysis). The three sections of the equivalent model can respectively represent the electrical behavior of the transmitter, the mechanical behavior of the resonating magnet (for example, specifically the rotational mechanics), and the electrical behavior of the receiver. The primary system variables include phasor voltages, currents, torques, and angular velocities. Phasor amplitudes can be reported as root-mean-square (rms) or other notation as indicated.

Electromechanical coupling (linkages) between the electrical and mechanical domains can be achieved through electrodynamic coupling represented by a gyrator circuit element. For an ideal (neither stores nor dissipates energy) two-port gyrator, the relationships for the two couplings are given by:

$$K_T = \frac{\tau_{mag}}{I_s} = \frac{V_{mag}}{\dot{\theta}} \quad (1)$$

$$K_R = \frac{\tau_{ind}}{I_L} = \frac{V_{ind}}{\dot{\theta}} \quad (2)$$

$K_T$ and $K_R$ are, respectively, the transmitter and receiver electrodynamic transduction coefficients (units of N·m·A⁻¹ or V·s·rad⁻¹). The magnetic fields produced by the coil are not explicitly expressed in the equivalent circuit model, but will be discussed further below. Ultimately it is the physical arrangement of the magnet and coils that determine the coefficients $K_T$ and $K_R$.

In the first electrical domain, a power source with source resistance $R_S$ can supply an ac voltage $V_S$ and ac current $I_S$ to a transmitter coil, represented by an electrical resistance $R_T$ and inductance $L_T$. In the mechanical domain, the mechanical oscillator is represented by torsional spring stiffness k, mass moment of inertia J and torsional damping coefficient b. The oscillator is subject to two electrodynamic torques: a torque $\vec{\tau}_{mag}$ from currents in the transmitter coil and a torque $\vec{\tau}_{ind}$ from currents in the receiver coil. Similarly, the rotational motion of the magnet $\dot{\theta}$ induces voltages $V_{mag}$ and $V_{ind}$ in the transmitter and receiver coils, respectively. Finally, in the second electrical domain, the receiver coil, represented by a resistance $R_R$ and inductance $L_R$, is connected to an arbitrary load impedance $Z_L$. In principle, each of the lumped element parameters can be predicted as a priori via relevant dimensions and material properties. Alternatively, most of the system parameters can also be determined via appropriate experimental tests. In this work, a combination of approaches will be used, since some parameters may be easier to calculate, whereas some parameters may be easier to measure/infer.

The transmitter coil used in this work is a multi-layer, multi-turn pancake type coil of inner diameter $d_1$, outer diameter $d_2$ and thickness l, having N turns. The field produced by the transmitter coil is modeled by a short-solenoid formula, where the amplitude of the on-axis magnetic field along the z-axis (refer to FIG. 3) is calculated as $$B_z = \frac{\mu_0 N I_S}{2l(d_2 - d_1)}\left[(l+2z)\ln\left(\frac{a_1}{a_2}\right) + (l-2z)\ln\left(\frac{a_3}{a_4}\right)\right] \quad (3)$$

For example, $a_1 = d_2 + \sqrt{d_2^2 + (l+2z)^2}$, $a_2 = d_1 + \sqrt{d_1^2 + (l+2z)^2}$, $a_3 = d_2 + \sqrt{d_2^2 + (l-2z)^2}$, $a_4 = d_1 + \sqrt{d_1^2 + (l-2z)^2}$ and z can be the distance from the centroid of the transmitter coil.

For modeling and experimental purposes, the magnetization axis of the receiver magnet is oriented perpendicular to the magnetic field generated by the transmitter coil, so as to maximize the torque acting on the magnet. In this configuration, the torque induced on the receiver magnet is $$\tau_{mag} = \left|\vec{m} \times \vec{B}_z\right| = \frac{B_r}{\mu_0} v_{mag} B_z \quad (4)$$

$\vec{m} = \vec{M} v_{mag}$ is the net magnetic moment of the receiver magnet in which $v_{mag}$ is the magnet volume and $\vec{M}$ is the magnetization of the magnet. Assuming ideal magnetization, $|\vec{M}| = B_r/\mu_0$ where $B_r$ is the remanence and $\mu_0$ is the free space permeability. The magnetic field gradients produced by the transmitter coil can also produce forces acting on the magnet, but since the rotation angles are assumed small, the forces can be assumed to be negligible.

The AC current to the transmitter coil $I_S$ and the magnetic field $B_z$ can be measured and controlled. Substituting (3) into (4), an explicit expression for the excitation torque can be derived.

$$\tau_{mag} = \frac{NB_r v_{mag} I_S}{2l(d_2 - d_1)} \left[ (l + 2z)\ln\left(\frac{a_1}{a_2}\right) + (l - 2z)\ln\left(\frac{a_3}{a_4}\right) \right] \quad (5)$$

$$K_T = \frac{NB_r v_{mag}}{2l(d_2 - d_1)} \left[ (l + 2z)\ln\left(\frac{a_1}{a_2}\right) + (l - 2z)\ln\left(\frac{a_3}{a_4}\right) \right] \quad (6)$$

To stay within allowable human exposure limits for examples utilized for use within or in proximity to a human, the magnetic field can be limited such that a maximum 2 $mT_{rms}$ field is produced at the centroid of the coil. According to some standards, a maximum permissible magnetic field (in a controlled environment) for exposure of the head and torso at 820 Hz can be 2.51 $mT_{rms}$. The torque $\vec{\tau}_{mag}$ and transmitter electrodynamic transduction coefficient $K_T$ can change with the distance between the transmitter and the receiver. Both torque and $K_T$ can follow the same decreasing trend as the field decreases with the increase in the distance.

In order to model the receiver electrodynamic coupling coefficient $K_R$, the flux interaction between the receiver magnet and receiver coil can be computed using a script in MATLAB, or script used along with another software package, that utilizes the calculated magnetic field produced by a cuboidal magnet. For the sake of simplicity, a single magnetic volume having equivalent height to the two-magnets arrangement surrounded by coils can be considered. The value of the transduction coefficient can depend on the rotational angle of the magnet. Within the operational range (for example, ±11°), $K_R$ can be nearly constant. For later computation purposes, a peak value of $K_R$=0.014 V·s·rad$^{-1}$ can be used.

For later comparison with experimental results a simplified model of the EWPT micro-receiver can be considered with the following simplifications. First, the torque generated by the transmitted field source $\tau_{mag}$ can be well controlled during the experiments, so an ideal torque source can be used in a model for calculations (eliminating the need to model the transmitter coil). Second, at low frequencies (<1 kHz), the coil reactance can be much smaller than resistance ($\omega L_R \ll R_R$) and so $L_R$ can be neglected, specifically in the device $R_R$=250Ω and $\omega L_R$=25Ω at 821 Hz. Third, the complex load impedance $Z_L$ can be replaced with a resistive load $R_L$, since the output impedance at resonance can be purely real and hence the optimal load can be real.

Using circuit analysis, it can be shown that the frequency-dependent load voltage for an arbitrary load resistance can be $$V_L = \frac{\tau_{mag} K_R}{\left(b + j\omega J + \frac{k}{j\omega}\right)(R_R + R_L) + K_R^2} R_L \quad (7)$$

In order to explicitly describe the system performance, three special cases are discussed below.

Case I: Open-Circuit:

When there is no external load connected, the frequency-dependent open circuit voltage output is $$V_L|_{R_L=\infty} = \frac{\tau_{mag} K_R}{\left(b + j\omega J + \frac{k}{j\omega}\right)} \quad (8)$$

Case II: Resonance:

At resonance i.e., when $\omega = \omega_r = \sqrt{k/J} = 2\pi f_r$, where $f_r$ is the resonant frequency in Hz, the impedance due to torsional spring stiffness k and the mass moment of inertia J cancel which, (for a given load resistance) maximizes the rotational displacement, angular velocity, and load voltage and time-averaged load power. In this case, $$V_L|_{\omega=\omega_r} = \frac{\tau_{mag} K_R}{b(R_R + R_L) + K_R^2} R_L \quad (9)$$

$$P_L|_{\omega=\omega_r} = \frac{V_L^2}{R_L} \quad (10)$$

where (10) assumes $V_L$ is the rms voltage (as opposed to peak voltage).

Case III: Resonance+Optimal Load:

For maximum power transfer to a load, the optimal load is the complex conjugate of the output impedance of the system $Z_{L\_opt} = Z_{out}^*$. At resonance ($\omega = \omega_r$), the total output electrical impedance is purely real, and consequently the optimal load resistance is $$R_{L\_opt} = \frac{K_R^2}{b} + R_R = R_R(\gamma + 1) \quad (11)$$

Here, $\gamma = K_R^2 / bR_R$ is a unitless parameter called 'electrodynamic coupling strength' that represents the electromechanical energy conversion effectiveness of an electrodynamic transducer. Therefore, the corresponding load voltage and maximum time-average load power become $$V_{opt} = V_L \Big|_{\substack{\omega=\omega_r \\ R_L = R_{L\_opt}}} = \frac{\tau_{mag} K_R}{2b} \quad (12)$$

$$P_{max} = P_L \Big|_{\substack{\omega=\omega_r \\ R_L = R_{L\_opt}}} = \frac{\tau_{mag}^2 K_R^2}{4b^2 R_{L\_opt}} \quad (13)$$

It is evident from (12) and (13) that the output performance (voltage and power) of the EWPT receiver greatly depends on the torque $\tau_{mag}$ on the receiver magnet. The higher the torque is, the higher the electrodynamic couplings ($K_T$, $K_R$) will be. Eqn. (4) indicates that the amount of torque on a magnet depends on the volume of the magnet $v_{mag}$; torque increases with the increase in the magnet volume. Therefore, a larger magnet is better, but effectively makes the overall size of the EWPT receiver bigger. Moreover, the size of the EWPT receiver can be constrained by the specific end-use application. To first-order approximation, the power scales with the volume, and hence maximizing the power density (power per volume) of this type of electrodynamic receiver can be a design objective.

The simulation parameters used in the analytical calculation are shown in Table I, which have been derived from the geometry and material properties of the device components. The value of $K_R$ can be calculated using (11), from experimentally determined γ and b. This measured $K_R$ value (in Table I) closely matches with the simulated values discussed.

As an appendix to equations 1-13, the load voltage across a resistive load $R_L$ can be $$V_L = \frac{R_L}{R_R + R_L} V_{ind} \quad (14)$$

According to gyrator principle, the voltage induced in the coil $V_{ind}$ is given by

TABLE I

FIXED SYSTEM PARAMETERS USED FOR ANALYTICAL SIMULATION

| Parameter | Value |
|---|---|
| Inner diameter of transmitter coil, $d_1$ | 5 cm |
| Outer diameter of transmitter coil, $d_2$ | 15 cm |
| Thickness of the transmitter coil, I | 1.5 cm |
| Resistance of the transmitter coil, $R_T$ | 305 mΩ |
| Inductance of the transmitter coil, $L_T$ | 2.6 mH |
| No. of turns in the transmitter coil, N | 169 |
| *Resistance of receiver coil, $R_R$ | 250 Ω |
| *Inductance of receiver coil, $L_R$ | 4.8 mH |
| *No. of turns of receiver coil | 996 |
| Volume of the receiver magnet | $8 \times 10^{-8}$ m$^3$ |
| Torsional mass moment of inertia, J | $1.61 \times 10^{-9}$ Kg·m$^2$ |
| Torsional spring stiffness, k | $4.28 \times 10^{-2}$ N·m·rad$^{-1}$ |
| Torsional damping coefficient, b | $5.03 \times 10^{-8}$ N·m·s·rad$^{-1}$ |
| Residual flux density of the magnet, $B_r$ | 1.38 T |
| Receiver electrodynamic coupling, $K_R$ | 0.011 V·s·rad$^{-1}$ |
| Permeability of free space, $\mu_0$ | $4\pi \times 10^{-7}$ N·A$^{-2}$ |

*Combined values for the two series-connected receiver coils $$V_{ind} = K_R \dot{\theta} = K_R \frac{\tau_{mag}}{Z_m} \quad (15)$$

where $Z_m$ is the mechanical impedance of the receiver, expressed as $$Z_m = \left(b + j\omega J + \frac{k}{j\omega}\right) + \frac{K_R^2}{R_R + R_L} \quad (16)$$

Substituting (15) and (16) into (14) yields $$V_L = \frac{\tau_{mag} K_R}{\left(b + j\omega J + \frac{k}{j\omega}\right)(R_R + R_L) + K_R^2} R_L \quad (17)$$

The total electrical output impedance $Z_{out}$ at the receiver terminals is $$Z_{out} = \frac{K_R^2}{b + j\omega J + \frac{k}{j\omega}} + R_R \quad (18)$$

A base frame/serpentine suspension beam structure (and spacers) can be fabricated by through-etching a 300 μm thick double-side-polished, 4-inch Si wafer. A single mask photolithography process is used. First, the wafer can be coated with 11 μm thick photoresist (AZ9260) and baked on a hotplate at 112° C. for 3 min, after regular wafer cleaning and HMDS treatment. The photoresist can be then exposed using the specific mask with appropriate exposure dose and can be developed using 3:1 DI water: AZ400K developer for 6 min. Then, the patterned wafer can be bonded to a carrier wafer (500 μm thick, single-side-polished, 4-inch Si wafer) by using the same thick photoresist. The wafer stack can be baked for an additional ~15 min to drive off the solvent from the resist in the bond layer. The resist residue in normally cleared areas of the pattern of the bonded sample can be removed by oxygen plasma ashing at 300 W, 300 sccm for 1 min. Then, through-etching of the patterned sample can be done by deep reactive-ion etching (DRIE). Once done, each individual structure is released on the carrier wafer which is then cleaned off using acetone and is ready for assembling the device components. Timing values are provided for example purposes, and any appropriate time period can be used for the processes discussed.

Figure 10:
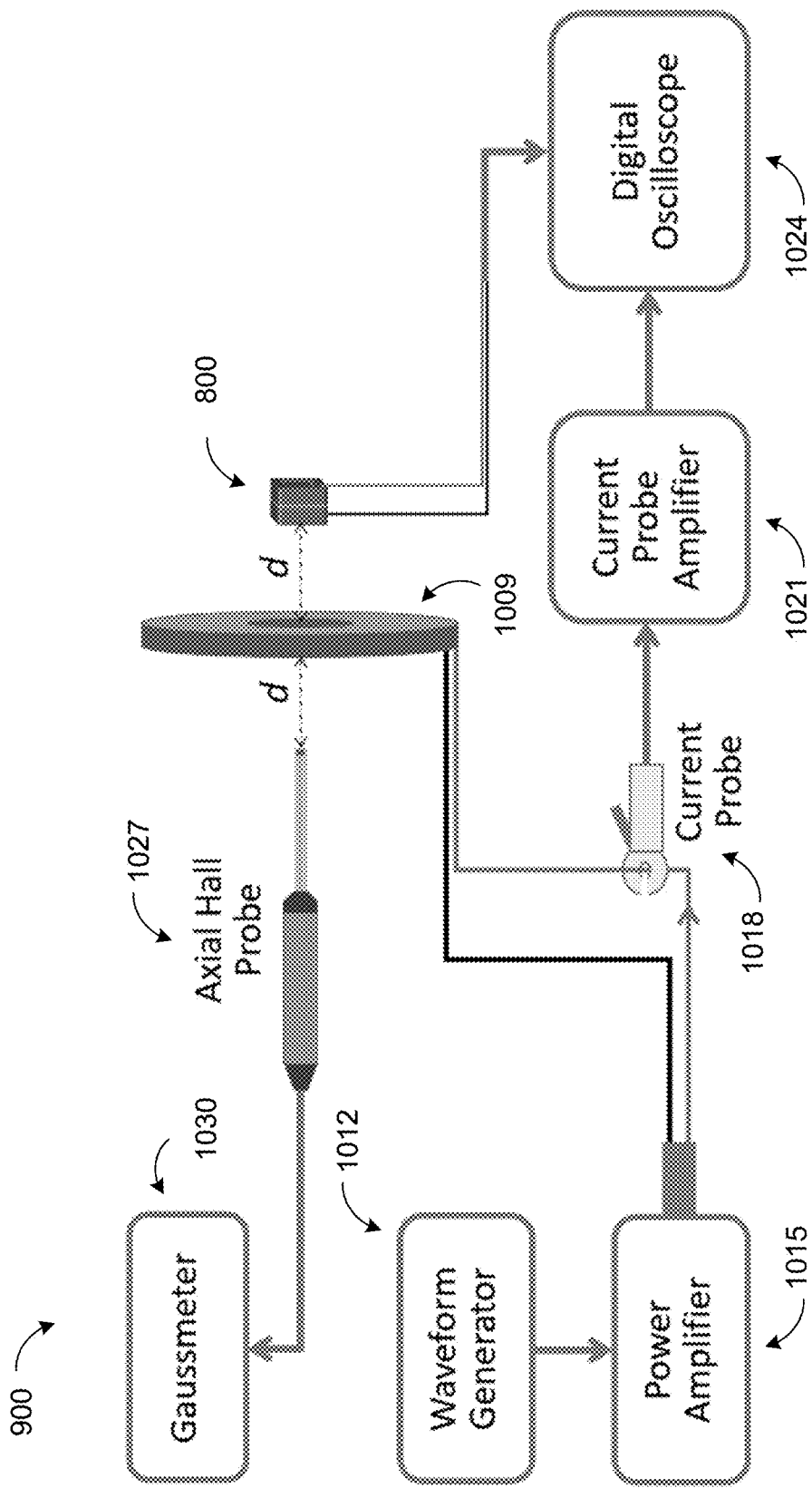
FIG. 10 illustrates a more detailed version of the EWPT system of FIG. 9, according to the present disclosure.

FIG. 10 shows a more detailed schematic block diagram of the EWPT system 900. A fabricated and assembled EWPT receiver 800 can be characterized under alternating magnetic fields of various amplitudes and frequencies generated by a transmitter coil. A 169-turn (Ø15 cm×1.5 cm) pancake-shaped or other transmitter coil 1009 can be made of 12 AWG laminated copper magnet wire, and can have a coil figure of merit fm=13.4×106 W·T$^{-2}$ and generate uniaxial fields (i.e., at any given point, the field only increases and decreases in time, but does not change direction) around it.

As seen from the block diagram, an arbitrary waveform generator 1012 supplies AC voltage to a linear or other appropriate power amplifier 1015 to generate an AC current which is fed to the transmitter coil. A current probe 1018 connected to a current probe amplifier 1021 can monitor the AC current. A multi-channel digital storage oscilloscope 1024 measures the input AC current to the transmitter coil as well as the output voltage generated by the EWPT receiver 800. An axial Hall probe 1027 connected to a gaussmeter 1030 measures the resultant (for a given AC current) magnetic field generated by the transmitter coil. The axial Hall probe 1027 (at the Hall probe tip) and the EWPT receiver 800 can be placed at opposite sides (on-axis and at the same distance, d) of the transmitter coil, assuming uniform B-field spatial distribution on both sides of the transmitter coil 1009.

Figure 11:
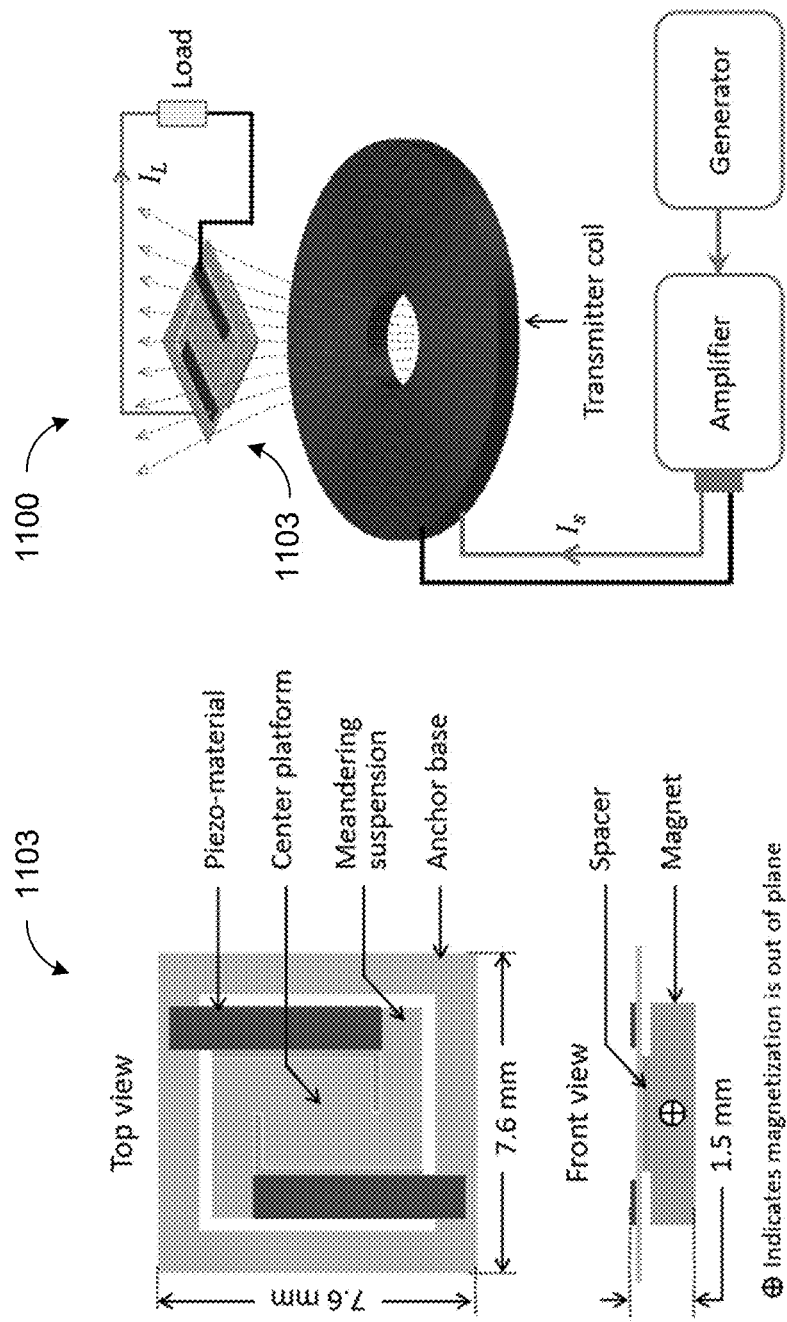
FIG. 11 illustrates a EWPT system using a piezoelectric EWPT receiver, according to the present disclosure.

FIG. 11 shows an example of a schematic block diagram of an EWPT system 1100 with piezo material on a meandering suspension of a EWPT receiver 1103. In some cases, the EWPT receiver 1103 with piezo material can be referred to as a piezoelectric EWPT receiver 1103.

The piezoelectric EWPT receiver 1103 comprises a double-clamped (to the anchor base) meandering titanium suspension with a center platform, two piezo-ceramic patches attached to the clamped arms of the meandering beams wherein the arms of the meandering beams attach to the anchor base or frame, and a laterally magnetized square permanent magnet mounted to the center platform (on the side opposite to the piezo-ceramic patches) via a spacer. The entire structure forms a resonant electromechanical transducer for power generation while oscillating torsionally under the influence of an external time-varying magnetic field. Titanium can be used or selected for its high strength, lower mass (since lower mass springs develop less inertia as suspension is displaced), and the fact that is not ferromagnetic (so as to not interfere with the magnetic fields).

Each piezo-ceramic patch constitutes a unimorph transducer and the piezos can be connected electrically in series. For maximum electrodynamic coupling with the external magnetic field, the magnet spans the entire area, a majority of the area, or at least a portion of the area over the meandering suspension. The spacer creates clearance between the magnet and the meandering beams during torsional oscillation. The external dimensions of the example piezoelectric EWPT receiver 1103 can be 7.6 mm×7.6 mm, with a thickness of 1.5 mm.

An alternating current $I_S$ can be supplied to a transmitter coil which generates a spatially distributed, time-varying magnetic field of desired frequency and amplitude. When the piezoelectric EWPT receiver 1103 is subjected to this field, a torsional oscillation is induced due to torque on the receiver magnet. This motion can generate dynamic stresses on the piezo-ceramic elements which, in turn, generate voltage by means of the piezoelectric effect. An electrical current $I_L$ flows through an external load connected across the metal electrodes on the piezo-surfaces, and hence power is delivered. The voltage and power generated by the piezoelectric EWPT receiver 1103 can be maximized at the torsional resonance of the mechanical suspension, as well as when the magnetization axis of the receiver magnet is oriented perpendicular to the applied magnetic field.

Figure 12:
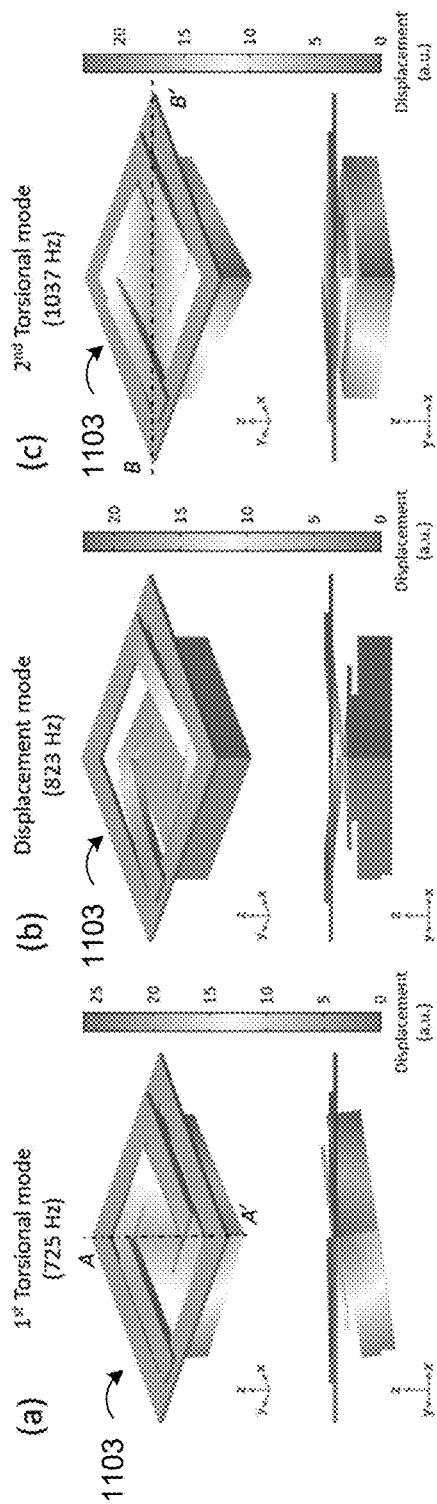
FIG. 12 illustrates resonance modes of the piezoelectric EWPT receiver of FIG. 11, according to the present disclosure.

FIG. 12 shows an isometric view of the piezoelectric EWPT receiver 1103 of FIG. 11. This figure can illustrate its mechanical resonances. Resonance behavior can be modeled by 3D finite element analysis (FEA) simulation using appropriate software packages.

To simulate the bonding layers (between the magnet, spacer and central platform, and between piezo-ceramic patches and suspension arms), a 20 μm-thick elastic layer with Young's modulus E=2 GPa and Poisson's ratio ν=0.25 can be used. The FEA simulations show that the first mode of vibration for the example EWPT receiver 1103 shown can occur at 725 Hz, which is a torsional rotation about the diagonal axis A-A', the second mode of vibration at 823 Hz corresponds to a displacement mode in the z-direction, and the third mode of vibration at 1037 Hz is a torsional rotation about the diagonal axis B-B'.

A frequency-domain FEA simulation can be performed to investigate the frequency response of the EWPT receiver 1103 for both the torsional rotation angle, θ and the no-load (open-circuit) voltage of the series-connected piezoelectric transducers. The oscillation of the receiver magnet can, in some examples, reach the maximum torsional rotation of 0.29°, about the diagonal axis A-A', and maximum voltage at the first mode of vibration (725 Hz). Note that for the simulated frequency response, a damping ratio ζ=0.007 can be used, corresponding to a Q-factor of 72.

Distribution simulations can describe the mechanical reliability of the EWPT receiver 1103 with various magnetic field amplitude excitations at resonance being considered. Mechanical limits can include: (a) the maximum rotation angle at which the magnet comes in contact with the clamped arms of the meandering suspension (±3.25° for the present design) and (b) the threshold rotation angle where any portion of the suspension reaches its yield stress. Considering the ductility of titanium, it is assumed gradual failure mode would occur whenever the equivalent von Mises stress exceeds the tensile yield strength of titanium (assumed to be $\sigma_{YS\text{-}Ti}$=275 MPa). For the piezoelectric elements, the tensile yield strength of PZT-5A (assumed to be $\sigma_{YS\text{-}PZT}$=140 MPa) can be utilized. The magnet can interfere with the suspension base before exceeding one of the stress-related failure limits. In the example shown, at the maximum rotation angle of ±3.25°, the maximum stress can be about 89 MPa, which is far below the failure limit for PZT-5A (or Ti).

For the design shown, choosing appropriate dimensions of the piezoelectric elements can maximize the output power. The shown design can be integrated using a commercial off-the-shelf piezoelectric element, for which length and width are adapted but thickness is standard. However, thickness of the piezoelectric element can be affected using further processing of the piezoelectric material e.g., chemical mechanical polishing (CMP).

With this in mind, a parametric FEA study can be used to determine the output power response of the piezoelectric transducer while varying the length and thickness of the piezoelectric elements. The dimensions that provide the optimal output power can be identified based on such an FEA simulation. If a width of the piezo is fixed at 1 mm (equal to the meander beam width), piezo length can vary from 0.75 mm to 6 mm in steps of 0.25 mm, and piezo thickness can vary from 13 μm to 195 μm in steps of 13 μm. Then, the resonant frequency of the first torsional mode of each receiver design can be determined via FEA modal study. Following this, each receiver design can be subjected to an applied field of 50 $\mu T_{rms}$ at the corresponding 1st torsional mode resonance, and the output average power for an adapted load resistance $R_a=1/(2\pi f_a C_0)$, with $f_a=\sqrt{f_{oc}f_{sc}}$, ($f_{oc}$ and $f_{sc}$ are the open-circuit and short-circuit resonant frequencies, respectively) can be calculated. The results on average power dependence on the dimensioning of piezoelectric elements can be analyzed for selection of the dimensions. This can also result in a multi-dimensional graph where the various dimensions (here thickness and length) can be graphed vs average power as dimensions vary. From such an analysis or graph, the piezo length in the shown design (5 mm) is very close to that of the optimal design (4.5 mm) however, a 52 μm piezo thickness (127 μm in the current design) can maximize the receiver's output power.

Figure 13:
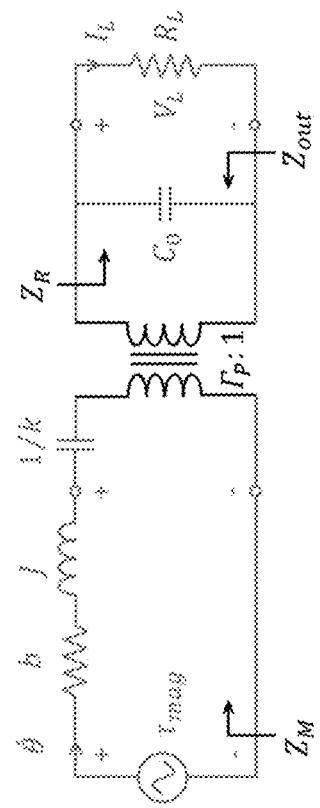
FIG. 13 illustrates an example equivalent electrical circuit of the EWPT system of FIG. 11, according to the present disclosure.

FIG. 13 shows an equivalent circuit 1300 of a piezoelectric EWPT receiver 1103 and a resistive load $R_L$. Other examples can be utilized with any load $Z_L$ rather than $R_L$. Equivalent circuit 1300 can be used in conjunction with FIG. 2 for the Mechanical Domain and Electrical Domain.

The result can enable calculations based on a lumped-element electrical circuit model for the EWPT system 1100 of FIG. 11. Phasor voltages, currents, torques, and angular velocities can be system variables. In the first electrical domain (see FIG. 2), a power source with source resistance $R_S$ supplies an ac voltage $V_S$ and ac current $I_S$ to a transmitter coil, represented by an electrical resistance $R_T$ and inductance $L_T$. In the mechanical domain (FIG. 13), the mechanical oscillator is represented by torsional damping coefficient b, mass moment of inertia J and short-circuit torsional spring stiffness k. Finally, in the second electrical domain (FIG. 13), the blocked electrical capacitance of the piezoelectric transducer is represented by a capacitor $C_0$, and the output electrical terminals are connected to load impedance $Z_L$.

The electrodynamic transduction between the transmitter and receiver can be represented by a gyrator with electrodynamic transduction coefficient $K_T$. The piezoelectric coupling of the piezo transducers can be represented by a transformer with turns ratio $\Gamma_P$. The mechanical system can oscillate at an angular velocity $\dot{\theta}$ in response to an electrodynamic torque $\tau_{mag}$ induced on the receiver magnet due to incoming magnetic fields from the transmitter coil. The magnetic fields produced by the transmitter coil are not explicit in the equivalent circuit model, but will be discussed later.

Due to the torsional motion of the mechanical system, an equivalent inertial force acts on the piezoelectric element (to the transverse direction) that can cause developing strain in the piezo-material. This strain induces charges across the piezo-capacitor $C_0$ and hence, a voltage is generated. The dielectric loss tangent of the piezoelectric material (tan δ=0.02 at 1 kHz, provided on the manufacturer's datasheet) can have negligible influence on the overall impedance and hence, can be neglected in the model (the impedance at 1 kHz is 506.9 kΩ for just the piezo capacitance, and 506.8 kΩ if the parallel leakage resistance $R_\omega=1/(2\pi f_r \tan \delta C_0)$ can be considered).

Generally, each lumped-element parameter can be derived using relevant geometric dimensions and material properties. However, due to the complicated design of the mechanical suspension and displacement (rotation/translation) of the central magnet mass, it is challenging to analytically derive all the standard lumped parameters for variables, particularly the torsional stiffness, rotational moment of inertia, or transformer turns ratio. Furthermore, some parameters (e.g., mechanical damping coefficient) can be determined by experimental measurements. Therefore, a combination of FEM results, analytical expressions, and experiments can be used to determine all these lumped parameters, further discussed below.

In the EWPT system 1100, the magnetic field produced by the transmitter coil (a multi-layer pancake type coil of inner diameter $d_1$, outer diameter $d_2$ and thickness l, having N turns) is modeled by a short-solenoid formula. The amplitude of the on-axis magnetic field can be calculated as $$B_z = \frac{\mu_0 N I_S}{2l(d_2-d_1)}\left[(l+2z)\ln\left(\frac{a_1}{a_2}\right)+(l-2z)\ln\left(\frac{a_3}{a_4}\right)\right] \quad (18)$$

where $a_1=d_2+\sqrt{d_2^2+(l+2z)^2}$, $a_2=d_1+\sqrt{d_1^2+(l+2z)^2}$, $a_3=d_2+\sqrt{d_2^2+(l-2z)^2}$, $a_4=d_1+\sqrt{d_1^2+(l-2z)^2}$, $\mu_0(=4\pi\times10^{-7}$ N·A$^{-2}$) is the permeability of free space, and z is the distance from the centroid of the transmitter coil. In order to maximize the torque acting on the receiver magnet, the magnetization axis of the magnet is oriented perpendicular to the magnetic field generated by the transmitter coil.

As a result, the amount of torque induced on the receiver magnet can be $$\tau_{mag}=|\vec{m}\times\vec{B_z}|=\frac{B_r}{\mu_0}v_{mag}B_z \quad (19)$$

where $\vec{m}=\vec{M}v_{mag}$ is the net magnetic moment of the receiver magnet in which $v_{mag}$ is the magnet volume and $\vec{M}$ is the magnetization of the magnet that is related to the remanence $B_r$ of the magnet material as $|\vec{M}|=B_r/\mu_0$ (assuming ideal magnetization). In addition to this torque, a pulling force also acts on the receiver magnet due to the magnetic field gradients produced by the transmitter coil, $$|\vec{F}|=|\vec{m}|\frac{dB_z}{dz} \quad (20)$$

where $$\frac{dB_z}{dz}$$

is the magnetic field gradient in the z-direction. Since the rotation angle of the magnet is fairly small, the pulling force and its effect are negligible. The effect of this pulling force on the operation of the system was studied via FEA. The results showed that the torsional rotation of the magnet was not affected by the force acting on the magnets. However, a negligible off-axis displacement (towards the incoming magnetic field), in the order of a few tens of nanometers, was observed.

For an ideal (neither stores nor dissipates energy) two-port gyrator, the electrodynamic transduction coefficient $K_T$ (units of N·m·A$^{-1}$ or V·s·rad$^{-1}$) can be defined as $$K_T=\frac{\tau_{mag}}{I_S}=\frac{V_{mag}}{\dot\theta} \quad (21)$$

where $V_{mag}$ is the induced voltage in the transmitter coil due the rotational motion $\dot\theta$ of the receiver magnet. On-axis magnetic field $B_z$ and corresponding values of torque $\tau_{mag}$ and electrodynamic transduction coefficient $K_T$ can be calculated and plotted as a function of distance between the transmitter coil and the micro-receiver. Both $\tau_{mag}$ and $K_T$ can decrease as the magnetic field $B_z$ decreases with the increase in the distance of such a plot. In this case, a 2 mT$_{rms}$ field is generated (requiring a source current $I_S$ of 872.5 mA$_{rms}$) at the centroid of the transmitter coil (z=0), which is well below a maximum allowable human exposure limit of 2.84 mT$_{rms}$ at 725 Hz (head and torso in controlled environment).

The piezoelectric transducer used in the micro-receiver can be electrically modeled using a standard transformer-based model. Since the EWPT receiver 1103 can include two identical unimorph piezoelectric transducers of capacitance $C_p$ connected in series, $C_0$ represents their equivalent series capacitance i.e., $C_0=C_p/2$.

The value of $C_0$ can be determined by $$C_0=\frac{\epsilon_0 wl}{2t_p}\epsilon_{33}^S=\frac{\epsilon_0 wl}{2t_p}(\epsilon_{33}^T-d_{31}^2/s_{11}^E) \quad (22)$$

where w, l, and $t_p$ are the width, length and thickness of the piezo-ceramic element, respectively; $\epsilon_0$ (=8.854×10$^{-12}$ F·m$^{-1}$) is the permittivity of free space; $\epsilon_{33}^S$ is the permittivity component at constant strain with the plane-stress assumption of a thin beam and $\epsilon_{33}^T$ is the permittivity component at constant stress; $d_{31}$ is the piezoelectric charge constant and $s_{11}^E$ is the elastic compliance at constant electric field. Assuming a lossless electromechanical transducer, the turn ratio $\Gamma_p$ of the transformer can be determined by using $$\Gamma_p=\sqrt{\kappa^2 k_0 C_0} \quad (23)$$

where $k_0$ is the open-circuit (or short-circuit) torsional spring stiffness (determined as 1.03×10$^{-2}$ N·m·rad$^{-1}$ from FEA simulation) and $\kappa^2$ represents the coupling coefficient of the piezoelectric transducer, defined as the ratio of the energy converted by the transducer to the total input energy i.e., electric energy and elastic strain energy, respectively ($\kappa^2$=E/U at corresponding resonances). From simulation, $\kappa^2$ can be determined as 2.47×10$^{-3}$ (at resonance) and consequently using (6), the transformer turn ratio $\Gamma_p$ can be calculated as 8.8×10^(−8).

An ideal torque source can be considered since the torque $\tau_{mag}$ generated by the transmitted magnetic field source (transmitter coil) is well controlled during the experiments. Second, the complex load impedance $Z_L$ can be replaced with a resistive load $R_L$ for the sake of simplicity. As indicated in the circuit diagram, $Z_M$ and $Z_{out}$ represent the mechanical and total output impedances of the electromechanically coupled system, respectively, whereas $Z_R$ is the total electrical impedance of the piezoelectric transducer plus load.

Applying AC circuit analysis, the frequency-dependent voltage across an arbitrary load resistance $R_L$ can be obtained as $$V_L = \frac{\Gamma_p \tau_{mag}}{\left(b + j\omega J + \frac{k}{j\omega}\right)(1 + j\omega C_0 R_L) + \Gamma_p^2 R_L} R_L \tag{24}$$

Table II shows the parameters used in the analytical calculation, derived from the geometry and material properties of the components used in the example EWPT system 1100.

Three special cases are considered and discussed below to explicitly describe the performance of the piezoelectric micro-receiver under various harmonic excitation and load conditions.

TABLE II

SYSTEM PARAMETERS USED FOR ANALYTICAL SIMULATION

| Parameter | Value |
|---|---|
| Inner diameter of transmitter coil, $d_1$ | 5 cm |
| Outer diameter of transmitter coil, $d_2$ | 15 cm |
| Thickness of the transmitter coil, l | 1.5 cm |
| Resistance of the transmitter coil, $R_T$ | 305 mΩ |
| Inductance of the transmitter coil, $L_T$ | 2.6 mH |
| No. of turns in the transmitter coil, N | 169 |
| Volume of the receiver magnet, $v_{mag}$ | $2.5 \times 10^{-8}$ m$^3$ |
| Residual flux density of the magnet, $B_r$ | 1.3 T |
| Length of piezo-ceramic layer, l | 5 mm |
| Width of piezo-ceramic layer, w | 1 mm |
| Thickness of piezo-ceramic layer, $t_p$ | 127 μm |
| Thickness of suspension base, $t_s$ | 125 μm |
| Piezoelectric charge constant, $d_{31}$ | $-190 \times 10^{-12}$ m · V$^{-1}$ |
| Permittivity component at constant strain, $\epsilon_{33}^S$ | 1800 |
| Capacitance of piezo elements in series, $C_0$ | 314 pF |
| Torsional mass moment of inertia, J | $4.96 \times 10^{-10}$ Kg · m$^2$ |
| Torsional spring stiffness (open-circuit), $k_0$ | $1.03 \times 10^{-2}$ N · m · rad$^{-1}$ |
| Transformer turn ratio, $\Gamma_\rho$ | $8.8 \times 10^{-8}$ |
| Mechanical quality factor, Q | 72 |
| Damping ratio, ζ | 0.007 |
| Torsional damping coefficient, b | $3.13 \times 10^{-8}$ N · m · s · rad$^{-1}$ |

Case I: No-Load Condition:

In the absence of any external load connected to the transducer, the frequency-dependent no-load (open-circuit) voltage output of the micro-receiver is $$V_L |_{R_L \to \infty} = \frac{\Gamma_p \tau_{mag}}{j\omega C_0 \left(b + j\omega J + \frac{k}{j\omega}\right) + \Gamma_p^2} \tag{25}$$

Case II: At Resonance:

When $\omega = \omega_r = \sqrt{k/J} = 2\pi f_r$, where $f_r$ is the resonant frequency in Hz, the rotational displacement and angular velocity (for a given load resistance) of the magnet-mass is maximized, since the impedances due to torsional spring stiffness k and mass moment of inertia J cancel. As a result, maximum stress can be generated in the piezo-ceramic elements and, therefore, the load voltage and time-average power delivered to the connected load can be maximized. In this case, $$V_L |_{\omega = \omega_r} = \frac{\Gamma_p \tau_{mag}}{b(1 + j\omega_r C_0 R_L) + \Gamma_p^2 R_L} R_L \tag{26}$$

$$P_L |_{\omega = \omega_r} = \frac{V_L^2}{R_L} \tag{27}$$

where $V_L$ and $\tau_{mag}$ are both root-mean-square (rms) values.

Case III: At Resonance with Optimal Resistive Load:

The load power can be maximized by choosing an impedance-matched optimal load resistance. The value of optimal load resistance is equal to the magnitude of the total output electrical impedance at the receiver terminals which, at resonance ($\omega = \omega_r$), is $$R_{L\_opt} = |Z_{out}| = \frac{b}{\sqrt{(\Gamma_p^2)^2 + (\omega_r C_0 b)^2}} \tag{28}$$

Therefore, the corresponding load voltage and maximum time-average power to the load resistance become $$V_{opt} = V_L \bigg|_{\substack{\omega = \omega_r \\ R_L = R_{L\_opt}}} = \frac{\Gamma_p \tau_{mag}}{2\sqrt{(\Gamma_p^2)^2 + (\omega_r C_0 b)^2}} \tag{29}$$

$$P_{max} = P_L \bigg|_{\substack{\omega = \omega_r \\ R_L = R_{L\_opt}}} = \frac{\Gamma_p^2 \tau_{mag}^2}{4b\sqrt{(\Gamma_p^2)^2 + (\omega_r C_0 b)^2}} \tag{30}$$

From the simplified equivalent electrical circuit model presented in FIGS. 2 and 13, the angular velocity of the receiver magnet due to the driving torque $\tau_{mag}$ is given by $$\dot{\theta} = \frac{\tau_{mag}}{Z_M} = \frac{\tau_{mag}}{\left(b + j\omega J + \frac{k}{j\omega}\right) + \Gamma_p^2 Z_R} \tag{31}$$

where $Z_R$ in the mechanical impedance $Z_M$ of the receiver reads as $$Z_R = \frac{\frac{1}{j\omega C_0} R_L}{\frac{1}{j\omega C_0} + R_L} = \frac{R_L}{1 + j\omega C_0 R_L} \tag{32}$$

Now, according to a lossless two-port transducer principle (in this case, the transformer and two capacitances 1/k and $C_o$), the voltage across the load resistance $R_L$ $$V_L = \frac{\tau_{mag} - \left(b + j\omega J + \frac{k}{j\omega}\right)\dot{\theta}}{\Gamma_p} \tag{33}$$

Combining Equations (31), (32), and (33) can yield $$V_L = \frac{\Gamma_p \tau_{mag}}{\left(b + j\omega J + \frac{k}{j\omega}\right)(1 + j\omega C_0 R_L) + \Gamma_p^2 R_L} R_L \qquad (34)$$

The total electrical output impedance $Z_{out}$ at the micro-receiver output terminals is $$Z_{out} = \frac{\frac{1}{j\omega C_0}\left[\frac{1}{\Gamma_p^2}\left(b + j\omega J + \frac{k_0}{j\omega}\right)\right]}{\frac{1}{j\omega C_0} + \left[\frac{1}{\Gamma_p^2}\left(b + j\omega J + \frac{k_0}{j\omega}\right)\right]} \qquad (35)$$

Figure 14:
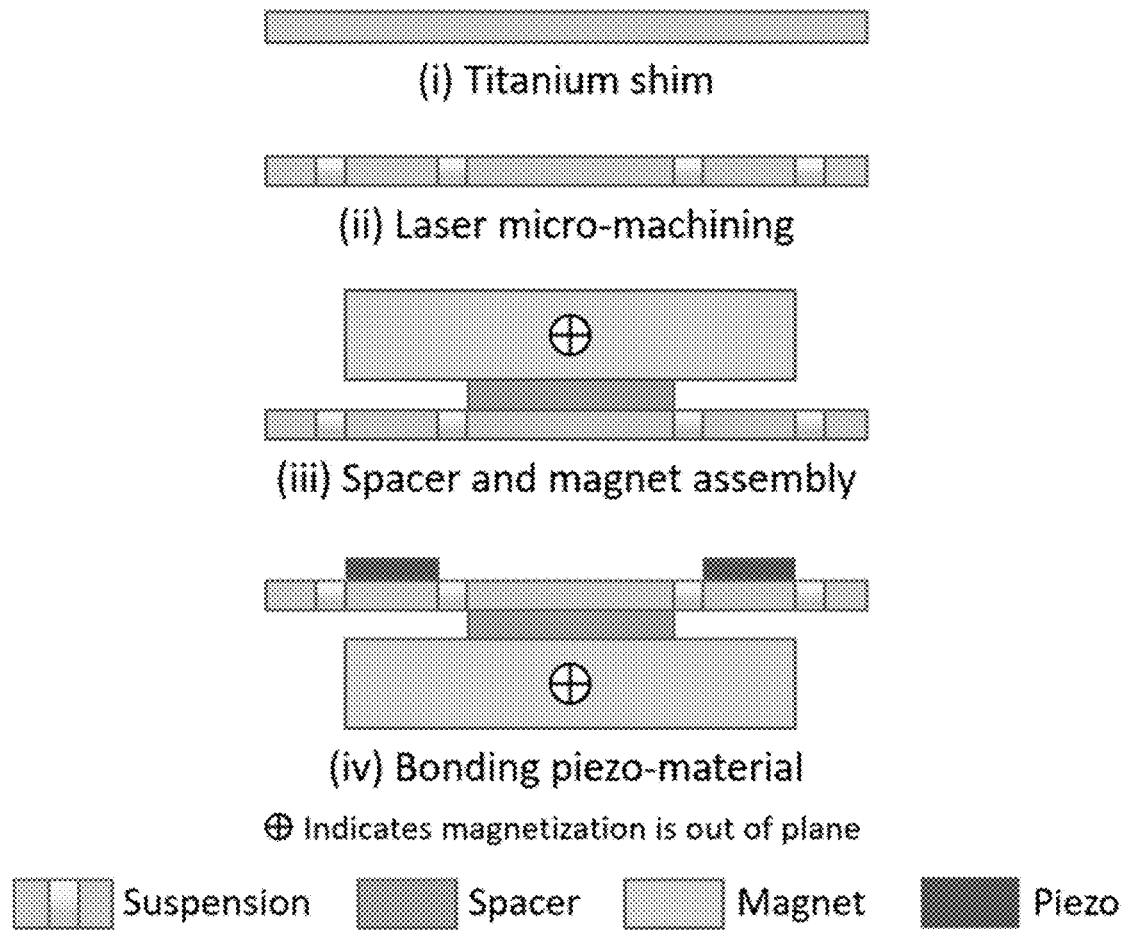
FIG. 14 illustrates an example fabrication process for the EWPT receiver of FIG. 11, according to the present disclosure.

FIG. 14 shows the schematics of the fabrication and assembly process steps for the EWPT receiver 1103. The meandering suspension structure with surrounding anchor base can be formed by laser micro-machining 125-µm-thick titanium (Ti) shim stock (McMaster-Carr, IL, USA). The width of the meandered beam can be 1 mm, and the area of the center platform can be 2.6×2.6 mm². A same sized silicon (Si) spacer, diced out of a 200-µm-thick, double-side polished Si wafer and a laterally magnetized 5×5×1 mm³ N50 NdFeB magnet can be bonded using cyanoacrylate to one side of the center platform. On the opposite side, two piezo-ceramic patches, each 5×1×0.127 mm³, diced from a large PZT-5A sheet with sputtered Nickel electrodes and poled through thickness (Piezo.com, MA, USA), were bonded to the arms of the meandered beam using silver epoxy (EO-21M-5, EpoxySet Inc., RI, USA) to form a series electrical connection between two unimorph piezo-ceramic transducers. Finally, the surrounding anchor base of the assembled device was clamped to a 3D printed plastic base, and the output electrical connections were created by bonding thin copper wires using silver epoxy.

Figure 15:
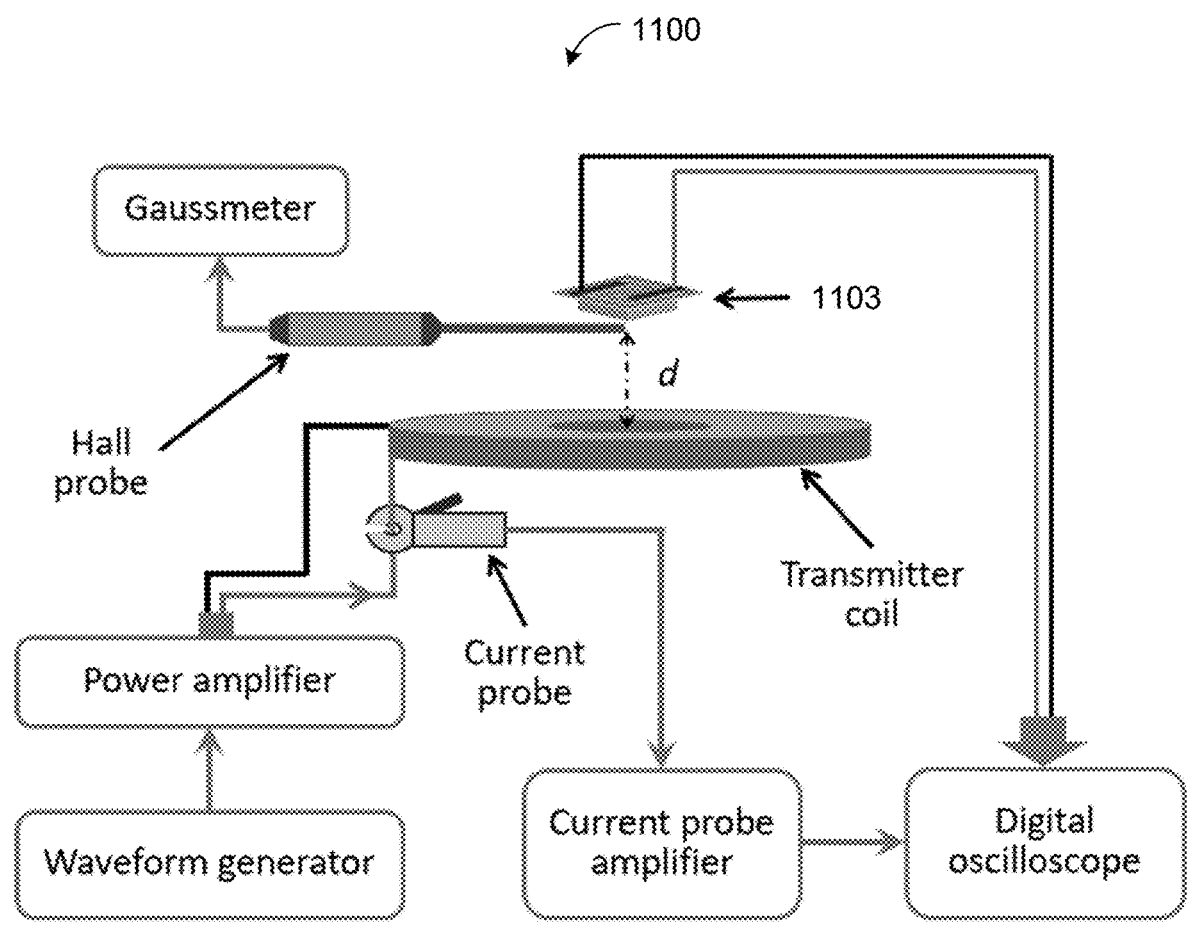
FIG. 15 a more detailed version of the EWPT system of FIG. 11, according to the present disclosure.

FIG. 15 shows a more detailed version of the EWPT system 1100. The EWPT system 1100 can include the piezoelectric EWPT receiver 1103 under various alternating magnetic fields transmitted from the transmitter coil. In some example setups, the EWPT receiver 1103 can be placed on a top surface (at the center) of a 3D printed plastic cover that covers a transmitter coil. The distance between the receiver and transmitter can be varied by changing the height between the plastic cover and the coil.

The transmitter coil (Ø150 mm×15 mm) can be made of 169 turns of 12 AWG copper magnet wire. It generates uniaxial fields and has $13.4×10^6$ W·T$^{-2}$ coil figure-of-merit ($f_m$). An arbitrary waveform generator in conjunction with a power amplifier can supply an alternating current input into the transmitter coil, which can be monitored by a current probe connected to a current probe amplifier. An oscilloscope can be used to measure input current to the transmitter coil and the output voltage generated by the micro-receiver prototype. For a given alternating current of the transmitter coil, the resultant B-field spatial distribution can be measured by a gaussmeter via a transverse Hall probe.

A 2 cm axial distance (d) can be maintained between the face of the receiver magnet and the centroid of the transmitter coil. The field amplitudes (between 10 and 100 µT$_{rms}$) of desired frequencies at the receiver magnet location can be achieved by adjusting the ac currents supplied to the transmitter coil. The EWPT receiver 1103 can exhibit a characteristic peak at its resonance (~724 Hz) indicating an under-damped 2nd-order system with Q-factor up to 75 (in air). The EWPT system 1100 can exhibit a slightly non-linear behavior, where the measured resonant frequency can shift lower as the amplitude of the magnetic field increases. The frequency of the 1st mode torsional resonant frequency can match with the 3D-FEA model (725 Hz). LEM simulation results can use the Q-factor Q=72 and transformer turn ratio $\Gamma_p=8.8×10^{-8}$ which correspond to the averages of the measured Q-factor and FEA determined $\Gamma_p$, respectively for each frequency response curve.

The time-average power can be determined by using $V_{rms}^2/R_L$, where $V_{rms}$ is the rms value of the measured voltage across each load resistance $R_L$. Results indicate that, the rms voltage can increase as the value of the load resistance increases, however, a maximum power (3.4 µW) can be delivered to an optimum load resistance of 650 kΩ.

Next, the voltage across and the time-average power delivered to the previously determined optimal load resistance can be measured by varying the amplitude of the alternating magnetic field, while its frequency is kept constant at 724 Hz. Simulation can show that the load voltage increases linearly, whereas the time-average power increases quadratically as the magnetic field amplitude increases. Measurement results also follow the same trend. However, both voltage and power tend to deviate from the linear trend at higher magnetic fields (over 45 µT$_{rms}$). The measured power reaches to 11 µW at 100 µT$_{rms}$ magnetic field, whereas the simulation predicts 15 µW based on the non-linear behavior of the micro-receiver noticed earlier in the frequency response analysis.

The time-average power delivered to the 650 kΩ optimum load can be measured at various distances (from 1 cm to 18 cm) between the transmitter coil and the micro-receiver prototype. In this example, a 2 mT$_{rms}$ magnetic field at 724 Hz frequency (below the human exposure safety limit at this frequency) can be generated at the centroid of the transmitter coil by limiting the supply current at 879 mA$_{rms}$. The amplitude of the magnetic field at various EWPT receiver 1103 locations can decay as the distance increases. The micro-receiver can generate maximum 360 µW power at 1 cm distance from the transmitter coil, that corresponds to 4.2 mWcm$^{-3}$ power density. The power generation can decrease since the magnetic field weakens as the distance from the source increases. However, the micro-receiver prototype can generate meaningful power (24 µW) at 10 cm distance, where the magnetic field strength can be measured to be 167 µT$_{rms}$.

While the EWPT receiver 1103 operates at stronger field amplitudes, any system nonlinearities can become more evident. Potential sources of non-linearity include mechanical spring stiffening effect and/or nonlinear piezoelectric properties. As a result, the resonant frequency moves further away from the resonance of 724 Hz at which measurements are taken for this example.

Although embodiments have been described herein in detail, the descriptions are by way of example. The features of the embodiments and other aspects described herein are representative and, in alternative embodiments, certain features and elements may be added or omitted. While features of the embodiments can be described with respect to a particular figure, it is understood that the features of the embodiments described with respect to one figure can also be utilized in conjunction with features of the embodiments described with respect to the other figures. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

Therefore, the following is claimed:

1. A wireless power transfer system, comprising:
   a transmitter that generates a time-varying magnetic field; and
   a receiver that converts energy from the time-varying magnetic field using electromechanical conversion, wherein the receiver comprises:
      a magnet platform suspended by a planar suspension comprising at least two connection points to a frame surrounding the planar suspension; and
      at least one spacer that connects at least one magnet to the magnet platform and provides clearance between the at least one magnet and the planar suspension to allow oscillation, wherein the at least one magnet extends beyond a perimeter of the magnet platform and over the planar suspension,
      wherein a shape of the planar suspension is tuned to cause the oscillation of the at least one magnet at a resonance frequency based on a frequency of the time-varying magnetic field, and wherein the oscillation of the at least one magnet generates electrical energy in the receiver.

2. The wireless power transfer system of claim 1, wherein the receiver further comprises a receiver coil, and the oscillation of the at least one magnet induces electrical energy in the receiver coil.

3. The wireless power transfer system of claim 1, wherein the oscillation comprises a torsional oscillation about an axis and wherein a direction of magnetization of the at least one magnet is orthogonal to the axis.

4. The wireless power transfer system of claim 1, wherein the planar suspension further comprises piezoelectric material, and wherein the oscillation of the at least one magnet produces electrical energy using the piezoelectric material.

5. The wireless power transfer system of claim 1, wherein the shape of the planar suspension is a serpentine shape.

6. The wireless power transfer system of claim 5, wherein the oscillation comprises a torsional oscillation about an axis, and a longest member of the serpentine shape is parallel to the axis.

7. The wireless power transfer system of claim 6, wherein the oscillation comprises a translational oscillation orthogonal to the axis.

8. A wireless power receiver for electromechanical conversion of energy from a time-varying magnetic field, the wireless power receiver comprising:
   a magnet platform connected to a planar suspension structure comprising a suspension comprising at least two connection points to a frame surrounding the suspension; and
   at least one magnet attached to the magnet platform, wherein the at least one magnet extends beyond a perimeter of the magnet platform and is suspended a distance over the planar suspension structure, wherein the planar suspension structure is tuned to cause oscillation of the at least one magnet at a resonance frequency based on a frequency of the time-varying magnetic field, and wherein the oscillation of the at least one magnet generates electrical energy in the wireless power receiver using electromechanical conversion.

9. The wireless power receiver of claim 8, wherein a magnet alignment structure secures the at least one magnet to a platform of the planar suspension structure using at least one of mechanical interference, glue, and epoxy.

10. The wireless power receiver of claim 8, wherein the frame, the platform, and the suspension are aligned in a plane.

11. The wireless power receiver of claim 8, wherein the planar suspension structure comprises a piezoelectric material, and wherein the oscillation of the at least one magnet produces electrical energy using the piezoelectric material.

12. The wireless power receiver of claim 8, wherein the suspension comprises a meander shape.

13. The wireless power receiver of claim 8, wherein the oscillation comprises a torsional oscillation about an axis.

14. The wireless power receiver of claim 8, wherein the oscillation comprises a translational oscillation.

15. The wireless power receiver of claim 8, wherein the planar suspension structure comprises at least one of silicon, steel, stainless steel, spring steel, and titanium.

16. A method, comprising:
   receiving, in a receiver, energy from a time-varying magnetic field, wherein the receiver comprises a planar suspension and a magnet attached to a magnet platform comprising at least two connection points to a frame surrounding the planar suspension, wherein the magnet extends beyond a perimeter of the magnet platform and is elevated over the planar suspension; and
   converting the energy from the time-varying magnetic field to electrical energy in the receiver, wherein a shape of the planar suspension causes oscillation of the magnet to generate the electrical energy in the receiver.

17. The method of claim 16, further comprising generating the time-varying magnetic field using a transmitter coil.

18. The method of claim 16, wherein the magnet platform comprises a magnet alignment structure that secures the magnet using mechanical interference.

19. The method of claim 16, wherein the planar suspension is aligned in a plane of a continuous planar suspension structure comprising the planar suspension, the frame, and the magnet platform.

20. The method of claim 16, wherein the oscillation comprises a torsional oscillation about an axis and wherein a longest member of the planar suspension is perpendicular to the axis.

* * * * *